US012787660B2

(12) United States Patent
Ho et al.

(10) Patent No.: US 12,787,660 B2
(45) Date of Patent: Nov. 3, 2026

(54) ELECTRONIC CIRCUIT AND COMPUTING DEVICE INCLUDING NONLINEAR ELEMENTS AND CONDUCTIVE MEMBERS

(71) Applicant: KABUSHIKI KAISHA TOSHIBA, Tokyo (JP)

(72) Inventors: Yinghao Ho, Kawasaki Kanagawa (JP); Hayato Goto, Kawasaki Kanagawa (JP)

(73) Assignee: KABUSHIKI KAISHA TOSHIBA, Kawasaki (JP)

(*) Notice: Subject to any disclaimer, the term of this patent is extended or adjusted under 35 U.S.C. 154(b) by 389 days.

(21) Appl. No.: 18/432,466

(22) Filed: Feb. 5, 2024

(65) Prior Publication Data

US 2024/0389479 A1 Nov. 21, 2024

(30) Foreign Application Priority Data

May 17, 2023 (JP) ................................ 2023-081762

(51) Int. Cl.
*H10N 69/00* (2026.01)

(52) U.S. Cl.
CPC .................................. *H10N 69/00* (2023.02)

(58) Field of Classification Search
CPC ...................................................... H10N 69/00
USPC ........................................................... 257/31
See application file for complete search history.

(56) References Cited

U.S. PATENT DOCUMENTS

| | | | |
|---|---|---|---|
| 10,950,654 B2 | 3/2021 | Kelly et al. | |
| 11,476,836 B1 | 10/2022 | Goto et al. | |
| 2022/0094358 A1* | 3/2022 | Phung | H10N 69/00 |

(Continued)

FOREIGN PATENT DOCUMENTS

| | | | |
|---|---|---|---|
| CN | 115497882 A * | 12/2022 | H10W 90/701 |
| CN | 115621267 A * | 1/2023 | |
| JP | 2022147628 A * | 10/2022 | H10D 84/01 |

(Continued)

OTHER PUBLICATIONS

D.R.W. Yost, et al., "Solid-state qubits integrated with superconducting through-silicon vias," npj | Quantum Information, vol. 6, No. 59, https://doi.org/10.1038/s41534-020-00289-8, 7 pages (2020).

(Continued)

*Primary Examiner* — Phuc T Dang
(74) *Attorney, Agent, or Firm* — Finnegan, Henderson, Farabow, Garrett & Dunner, LLP

(57) ABSTRACT

According to one embodiment, an electronic circuit includes a first base and a first structure. The first base includes a first face, a first side face, a second side face, a third side face, and a third other side face. The first side face, the second side face, the third side face, and the third other side face cross a plane along the first face. The first structure includes a first nonlinear element, and first to third conductive members. The first nonlinear element includes first and second element portions, and an intermediate Josephson junction provided between the first element portion and the second element portion. The first conductive member includes a first region and a first connection region. The second conductive member includes a second region and a second connection region. The third conductive member includes a third region and a third other region.

20 Claims, 19 Drawing Sheets

(56) References Cited

U.S. PATENT DOCUMENTS

| | | | | |
|---|---|---|---|---|
| 2022/0376161 | A1 * | 11/2022 | Goto | H10N 60/12 |
| 2024/0013085 | A1 | 1/2024 | Goto et al. | |

FOREIGN PATENT DOCUMENTS

| | | | |
|---|---|---|---|
| JP | 2023-20041 | A | 2/2023 |
| JP | 2023-112746 | A | 8/2023 |
| JP | 2024-8057 | A | 1/2024 |

OTHER PUBLICATIONS

Hayato Goto, "Double-Transmon Coupler: Fast Two-Qubit Gate with No Residual Coupling for Highly Detuned Superconducting Qubits," Phys. Rev. Applied, vol. 18, No. 034038, 10 pages (2022).

Sandoko Kosen, et al., "Building blocks of a flip-chip integrated superconducting quantum processor," Quantum Sci. Technol., vol. 7, No. 035018, https://doi.org/10.1088/2058- 9565/ac734b, 9 pages (2022).

* cited by examiner

ELECTRONIC CIRCUIT AND COMPUTING DEVICE INCLUDING NONLINEAR ELEMENTS AND CONDUCTIVE MEMBERS

CROSS-REFERENCE TO RELATED APPLICATIONS

This application is based upon and claims the benefit of priority from Japanese Patent Application No. 2023-081762, filed on May 17, 2023; the entire contents of which are incorporated herein by reference.

FIELD

Embodiments described herein relate generally to an electronic circuit and a computing device.

BACKGROUND

For example, electronic circuits including multiple nonlinear elements are used in computing devices. Improvements in performance are desired in electronic circuits and computing devices.

DETAILED DESCRIPTION

Figure 1:
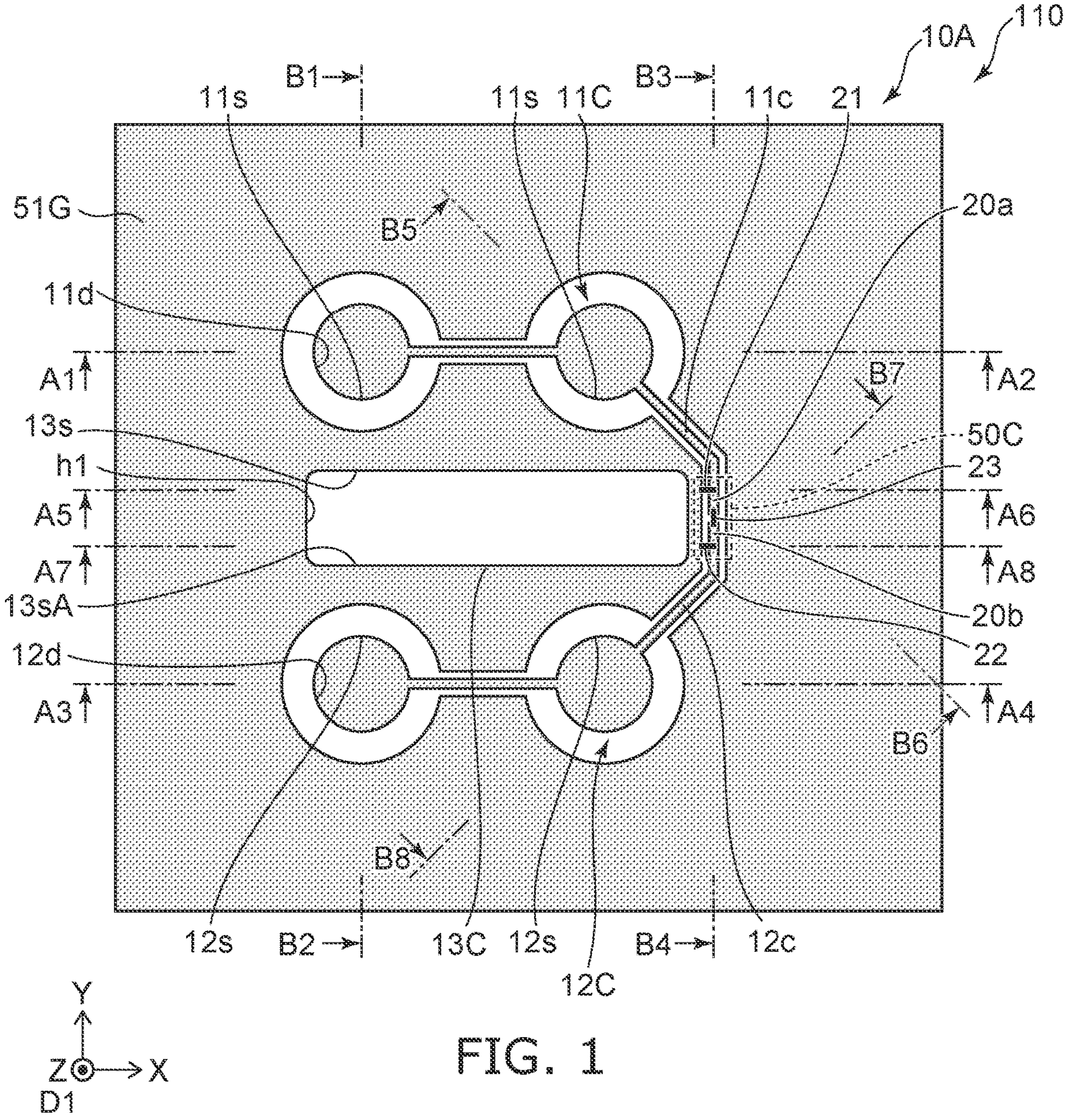
FIG. 1 is a schematic plan view illustrating an electronic circuit according to a first embodiment.

According to one embodiment, an electronic circuit includes a first base and a first structure. The first base includes a first face, a first side face, a second side face, a third side face, and a third other side face. The first side face, the second side face, the third side face, and the third other side face cross a plane along the first face. The first structure includes a first nonlinear element, a first conductive member, a second conductive member, and a third conductive member. The first nonlinear element includes a first element portion, a second element portion, and an intermediate Josephson junction provided between the first element portion and the second element portion. The first conductive member includes a first region and a first connection region. The first region is provided along the first side face. Aa part of the first connection region is electrically connected to the first region, and another part of the first connection region is electrically connected to the first element portion. The second conductive member includes a second region and a second connection region. The second region is provided along the second side face. A part of the second connection region is electrically connected to the second region, and another part of the second connection region is electrically connected to the second element portion. The third conductive member includes a third region and a third other region. The third region is provided along the third side face. The third other region is provided along the third other side face. A direction from the first region to the third region is along the plane. A direction from the second region to the third other region is along the plane.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic plan view illustrating an electronic circuit according to a first embodiment.

FIGS. 2A to 2D and FIGS. 3A to 3D are schematic cross-sectional views illustrating the electronic circuit according to the first embodiment.

Figure 4:
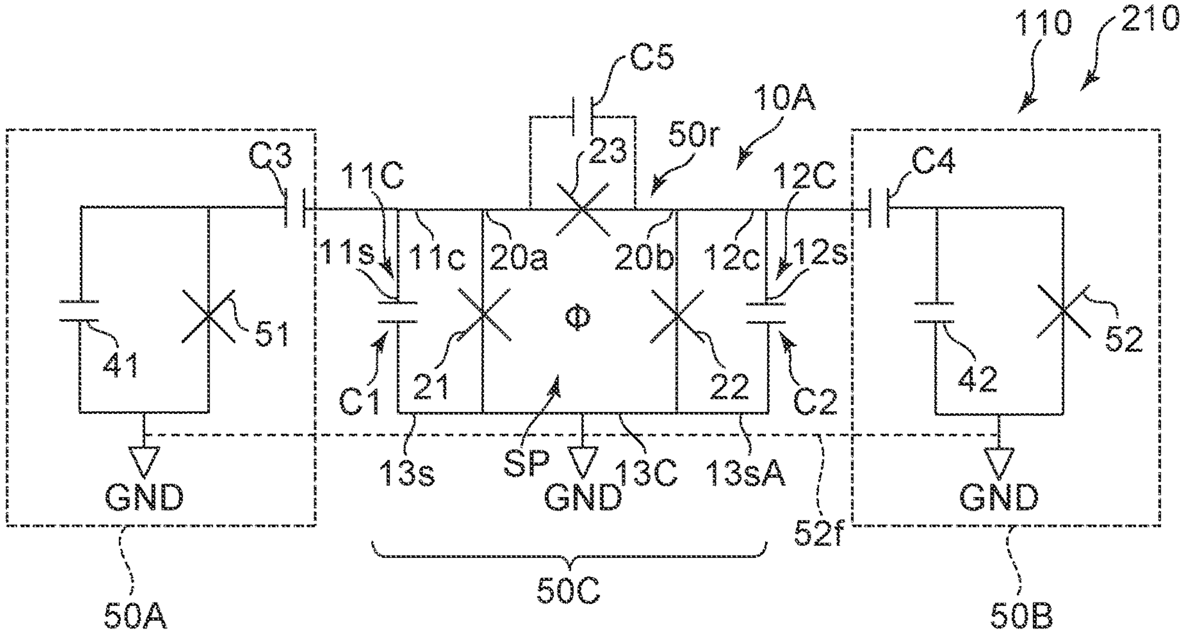
FIG. 4 is a schematic diagram illustrating the electronic circuit and a computing device according to the first embodiment.

FIG. 4 is a schematic diagram illustrating the electronic circuit and a computing device according to the first embodiment.

Figure 2A:
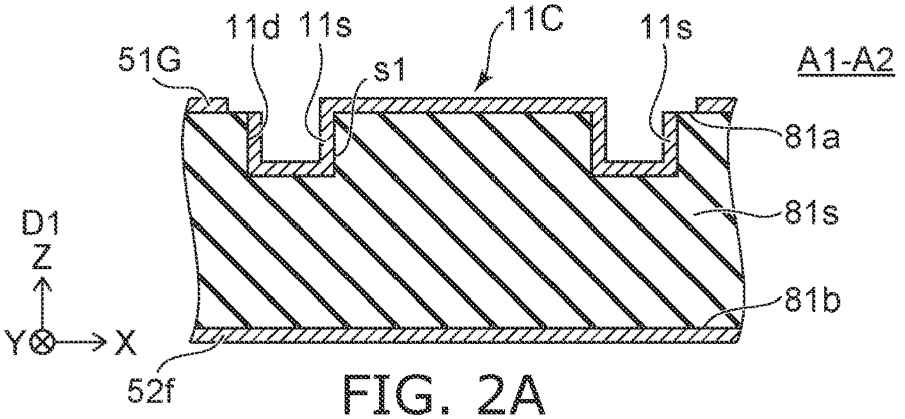
FIGS. 2A to 2D are schematic cross-sectional views illustrating the electronic circuit according to the first embodiment.
Figure 2B:
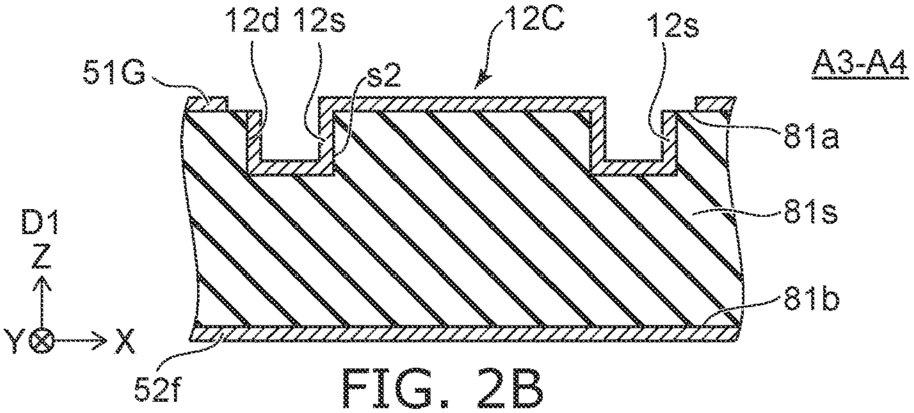
Figure 2C:
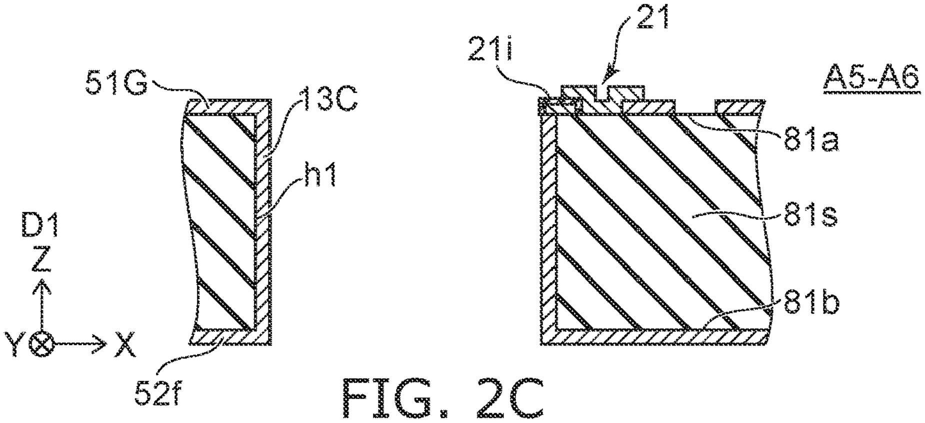
Figure 2D:
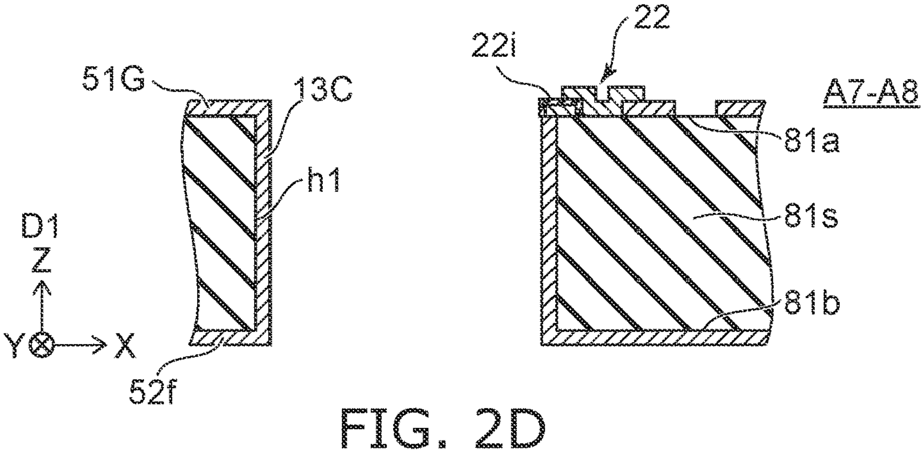
Figure 3A:
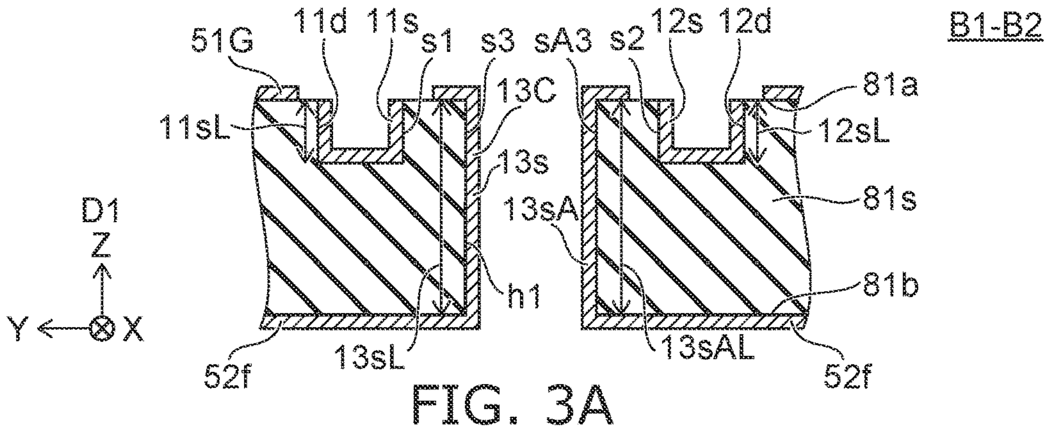
FIGS. 3A to 3D are schematic cross-sectional views illustrating the electronic circuit according to the first embodiment.
Figure 3B:
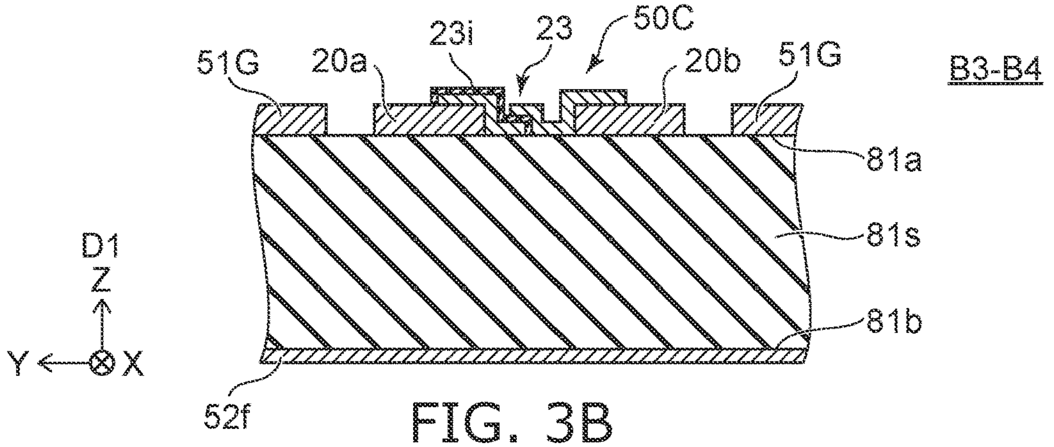
Figure 3C:
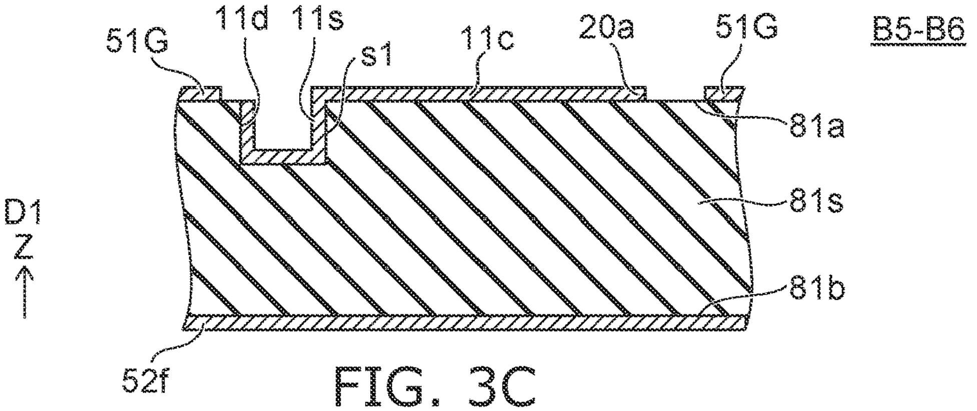
Figure 3D:
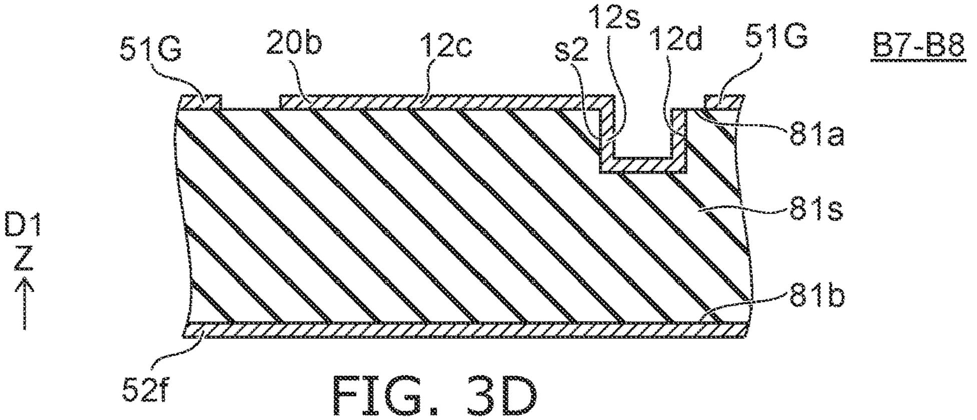

FIG. 2A is a sectional view taken along the line A1-A2 in FIG. 1. FIG. 2B is a sectional view taken along the line A3-A4 in FIG. 1. FIG. 2C is a sectional view taken along the line A5-A6 in FIG. 1. FIG. 2D is a sectional view taken along the line A7-A8 in FIG. 1. FIG. 3A is a sectional view taken along the line B1-B2 in FIG. 1. FIG. 3B is a sectional view taken along the line B3-B4 in FIG. 1. FIG. 3C is a sectional view taken along the line B5-B6 in FIG. 1. FIG. 3D is a sectional view taken along the line B7-B8 in FIG.

As shown in FIGS. 2A to 2D and FIGS. 3A to 3D, an electronic circuit according to the embodiment includes a first base 81*s* and a first structure 10A. The first base 81*s* may be, for example, an insulating substrate. The first base 81*s* may include, for example, a silicon substrate. The first base 81*s* may include an insulating film provided on the surface of the silicon substrate.

The first base 81*s* includes a first face 81*a* and a second face 81*b*. The first face 81*a* is, for example, an upper face. The second face 81*b* is, for example, a lower face. The first face 81*a* is along a X-Y plane. One direction along the X-Y plane is defined as an X-axis direction. The Y-axis direction is along the X-Y plane and is perpendicular to the X-axis direction. A direction perpendicular to the X-Y plane is defined as a Z-axis direction.

The first base 81*s* includes a first side face s1, a second side face s2, a third side face s3, and a third other side face sA3. The first side face s1, the second side face s2, the third side face s3, and the third other side face sA3 cross a plane (X-Y plane) along the first face 81*a*. In one example, these side faces are along the Z-axis direction. These side faces may be inclined with respect to the X-Y plane.

The first structure 10A includes a first nonlinear element 50C, a first conductive member 11C, a second conductive member 12C, and a third conductive member 13C.

As shown in FIGS. 1 and 3B, the first nonlinear element 50C includes a first element portion 20*a*, a second element portion 20*b*, and an intermediate Josephson junction 23. The intermediate Josephson junction 23 is provided between the first element portion 20*a* and the second element portion 20*b*. The intermediate Josephson junction 23 includes, for example, two conductive layers and an insulating layer 23*i* provided between the two conductive layers.

The first conductive member 11C includes a first region 11*s* and a first connection region 11*c*. As shown in FIG. 2A, the first region 11*s* is provided along the first side face s1. The first region 11*s* is, for example, a side face conductive film. A part of the first connection region 11*c* is electrically connected to the first region 11*s*. As shown in FIGS. 1 and 3C, another part of the first connection region 11*c* is electrically connected to the first element portion 20*a*.

The second conductive member 12C includes a second region 12*s* and a second connection region 12*c*. As shown in FIG. 2B, the second region 12*s* is provided along the second side face s2. The second region 12*s* is, for example, a side face conductive film. A part of the second connection region 12*c* is electrically connected to the second region 12*s*. As shown in FIGS. 1 and 3D, another part of the second connection region 12*c* is electrically connected to the second element portion 20*b*.

The third conductive member 13C includes a third region 13*s* and a third other region 13*s*A. As shown in FIG. 3A, the third region 13*s* is provided along the third side face s3. The third other region 13*s*A is provided along the third other side face sA3. The third region 13*s* and the third other region 13*s*A are, for example, side face conductive films. A direction from the first region 11*s* to the third region 13*s* is along the X-Y plane. A direction from the second region 12*s* to the third other region 13*s*A is along the X-Y plane.

For example, a capacitor element (first capacitor C1, see FIG. 4) is formed by the first region 11*s* and the third region 13*s*. Another capacitor element (second capacitor C2, see FIG. 4) is formed by the second region 12*s* and the third other region 13*s*A. By providing capacitor elements based on a plurality of side face conductive films, the area of the first structure 10A can be reduced. For example, high density electronic circuits are obtained. According to the embodiment, it is possible to provide an electronic circuit whose characteristics can be improved.

A direction perpendicular to the first face 81*a* is defined as a first direction D1. The direction from the second face 81*b* to the first face 81*a* is along the first direction D1. The first direction D1 is, for example, the Z-axis direction. As shown in FIG. 3A, the first base 81*s* includes a first recess 11*d* and a second recess 12*d*. The first recess 11*d* includes the first side face s1. The second recess 12*d* includes the second side face s2. In this example, the side face conductive films described above are provided along the side face of the recesses. The first conductive member 11C may be provided at the bottom of the first recess 11*d*. The second conductive member 12C may be provided at the bottom of the second recess 12*d*.

In this example, as shown in FIGS. 1 and 3A, the first base 81*s* includes a first hole h1. The first hole h1 is connected to the first face 81*a* and the second face 81*b*. The third side face s3 may be a part of the first hole h1. The third other side face sA3 may be another part of the first hole h1. In this example, the third region 13*s* and the third other region 13*s*A are provided along two side faces of the first hole h1.

As shown in FIG. 3A, the first structure 10A may include a second face conductive film 52*f*. The second face conductive film 52*f* is provided along the second face 81*b*. The third conductive member 13C is electrically connected to the second face conductive film 52*f*. The third region 13*s* and the third other region 13*s*A are electrically connected to the second face conductive film 52*f*.

The second face conductive film 52*f* can be set to a fixed potential, for example. The fixed potential is, for example, ground potential. The third conductive member 13C can be set to a fixed potential. The third region 13*s* and the third other region 13*s*A can be set to a fixed potential.

The third region 13*s* and the third other region 13*s*A may be, for example, TSV (Through Silicon Via).

As shown in FIG. 1, the first hole h1 is provided between the first region 11*s* and the second region 12*s*. Thereby, crosstalk between the first region 11*s* and the second region 12*s* can be suppressed. For example, noise is suppressed.

As shown in FIG. 3A, a length of the third region 13*s* in the first direction D1 is defined as a third region length 13*s*L. A length of the third other region 13*s*A in the first direction D1 is defined as a third other region length 13*s*AL. A length of the first region 11*s* in the first direction D1 is defined as a first region length 11*s*L. A length of the second region 12*s* in the first direction D1 is defined as a second region length 12*s*L. As already explained, the first direction D1 is perpendicular to the first face 81*a*.

The third region length 13*s*L is longer than the first region length 11*s*L. The third other region length 13*s*AL is longer than the second region length 12*s*L. A capacitor element of an appropriate size can be obtained by the third region 13*s* and the first region 11*s* having such a configuration. A capacitor element of an appropriate size can be obtained by the third other region 13*s*A and the second region 12*s* having such a configuration.

For example, the third region length 13*s*L is not less than 2 times and not more than 350 times the first region length 11*s*L. The third other region length 13*s*AL is not less than 2 times and not more than 350 times the second region length 12*s*L. For example, the third region length 13*s*L may be not less than 2 time and nor more than 10 times the first region length 11*s*L. The third other region length 13*s*AL may be not less than 2 times and not more than 10 times the second region length 12*s*L.

In one example, the third region length 13*s*L is not less than 100 μm and not more than 700 μm. The first region length 11*s*L is, for example, not less than 2 μm and not more than 80 μm. The third other region length 13*s*AL is, for example, not less than 100 μm and not more than 700 μm. The second region length 12*s*L is, for example, not less than 2 μm and not more than 80 μm. The third region length 13*s*L may be not less than 100 μm and not more than 300 μm. The first region length 11*s*L may be, for example, not less than 10 μm and not more than 80 μm. The third other region length 13*s*AL may be, for example, not less than 100 μm and not more than 300 μm. The second region length 12*s*L may be, for example, not less than 10 μm and not more than 80 μm.

For example, the first region length 11*s*L and the second region length 12*s*L are approximately 30 μm. The third region length 13*s*L and the third other region length 13*s*AL are, for example, about 200 μm or less.

The length of each of the first recess 11*d* and the second recess 12*d* in the X-axis direction is, for example, about 20 μm. The length of each of the first recess 11*d* and the second recess 12*d* in the Y-axis direction is, for example, about 20 μm. The shapes of these recesses are arbitrary. A plurality of first recesses 11*d* may be provided. A plurality of second recesses 12*d* may be provided. A conductive film may be provided along the side faces of these plurality of recesses.

A length of the first hole h1 in the X-axis direction is, for example, about 100 μm. A length of the first hole h1 in the Y-axis direction is, for example, about 26 μm. A length of the first hole h1 in the Z-axis direction corresponds to the thickness of the first base 81*s*.

A distance between the first region 11*s* and the third region 13*s* is, for example, not less than 5 μm and not more than 60 μm. A distance between the second region 12*s* and the third other region 13*s*A is, for example, not less than 5 μm and not more than 60 μm.

As shown in FIG. 4, a part of the first structure 10A is coupled to the first element structure 50A. Another part of the first structure 10A is coupled to the second element structure 50B. The first structure 10A is, for example, a coupler. The first nonlinear element 50C is, for example, a coupler.

As shown in FIG. 1, the first structure 10A may include a conductive layer 51G. The conductive layer 51G is provided on the first face 81*a*. As shown in FIGS. 2C and 2D, the conductive layer 51G is electrically connected to the second face conductive film 52*f* via the third region 13*s* and the third other region 13*s*A. The conductive layer 51G can be set to a fixed potential.

As shown in FIG. 1, the first nonlinear element 50C may further include a first Josephson junction 21 and a second Josephson junction 22. One end of the first Josephson junction 21 is electrically connected to the first element portion 20*a*. The other end of the first Josephson junction 21 is electrically connected to the third region 13*s*. In this example, the other end of the first Josephson junction 21 is electrically connected to the third region 13*s* via the conductive layer 51G.

One end of the second Josephson junction 22 is electrically connected to the second element portion 20*b*. The other end of the second Josephson junction 22 is electrically connected to the third other region 13*s*A. In this example, the other end of the second Josephson junction 22 is electrically connected to the third other region 13*s*A via the conductive layer 51G.

In this example, the first Josephson junction 21 and the second Josephson junction 22 are provided on the first face 81*a*. The first Josephson junction 21 includes, for example, two conductive layers and an insulating layer 21*i* provided between the two conductive layers. The second Josephson junction 22 includes, for example, two conductive layers and an insulating layer 22*i* provided between the two conductive layers.

As shown in FIG. 4, by the first region 11*s* and the third region 13*s*, the first capacitor C1 is formed. By the second region 12*s* and the third other region 13*s*A, the second capacitor C2 is formed. The first Josephson junction 21 is connected in parallel with the first capacitor C1. The second Josephson junction 22 is connected in parallel with the second capacitor C2. The intermediate Josephson junction 23 is provided between the first element portion 20*a* and the second element portion 20*b*. A fifth capacitor C5 may be formed between the first element portion 20*a* and the second element portion 20*b*.

As shown in FIG. 4, the first element structure 50A includes a first element Josephson junction 51 and a first element capacitor 41. The first element capacitor 41 is connected in parallel with the first element Josephson junction 51. This parallel circuit is coupled to the first element portion 20*a* via a third capacitor C3. The first element structure 50A is a qubit.

As shown in FIG. 4, the second element structure 50B includes a second element Josephson junction 52 and a second element capacitor 42. The second element capacitor 42 is connected in parallel with the second element Josephson junction 52. This parallel circuit is coupled to the second element portion 20*b* via a fourth capacitor C4. The second element structure 50B is a qubit.

As shown in FIG. 4, a computing device 210 according to the embodiment includes the first structure 10A, the first element structure 50A, and the second element structure 50B.

The first structure 10A includes a loop 50*r* including the intermediate Josephson junction 23, the first Josephson junction 21, and the second Josephson junction 22. In the embodiment, a magnetic flux ϕ of a space SP in the loop 50*r* can be modulated. By modulating the magnetic flux ϕ, the coupling strength between the coupler (first structure 10A) and the qubits may be controlled.

Figure 5:
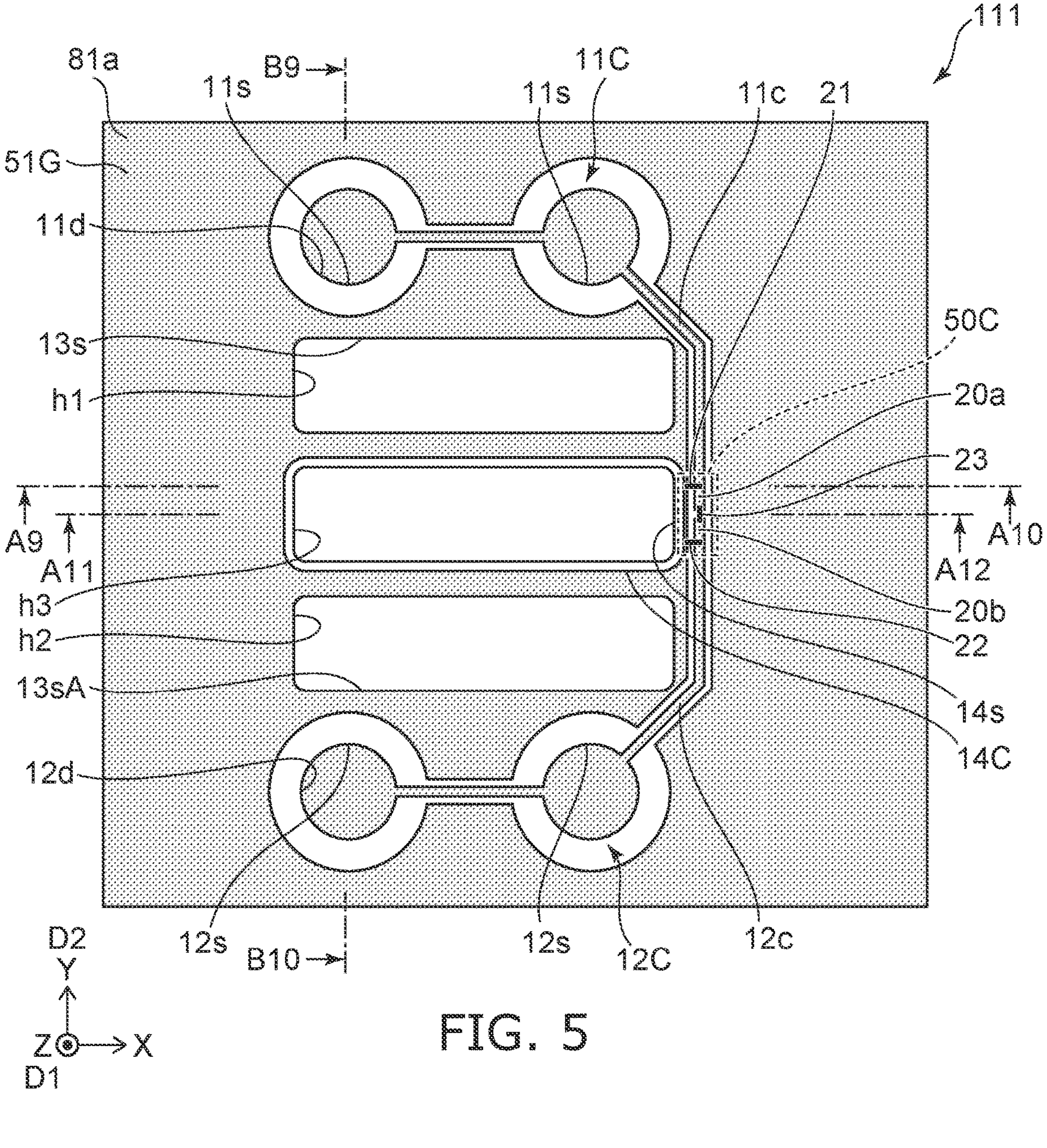
FIG. 5 is a schematic plan view illustrating an electronic circuit according to the first embodiment.
Figure 6:
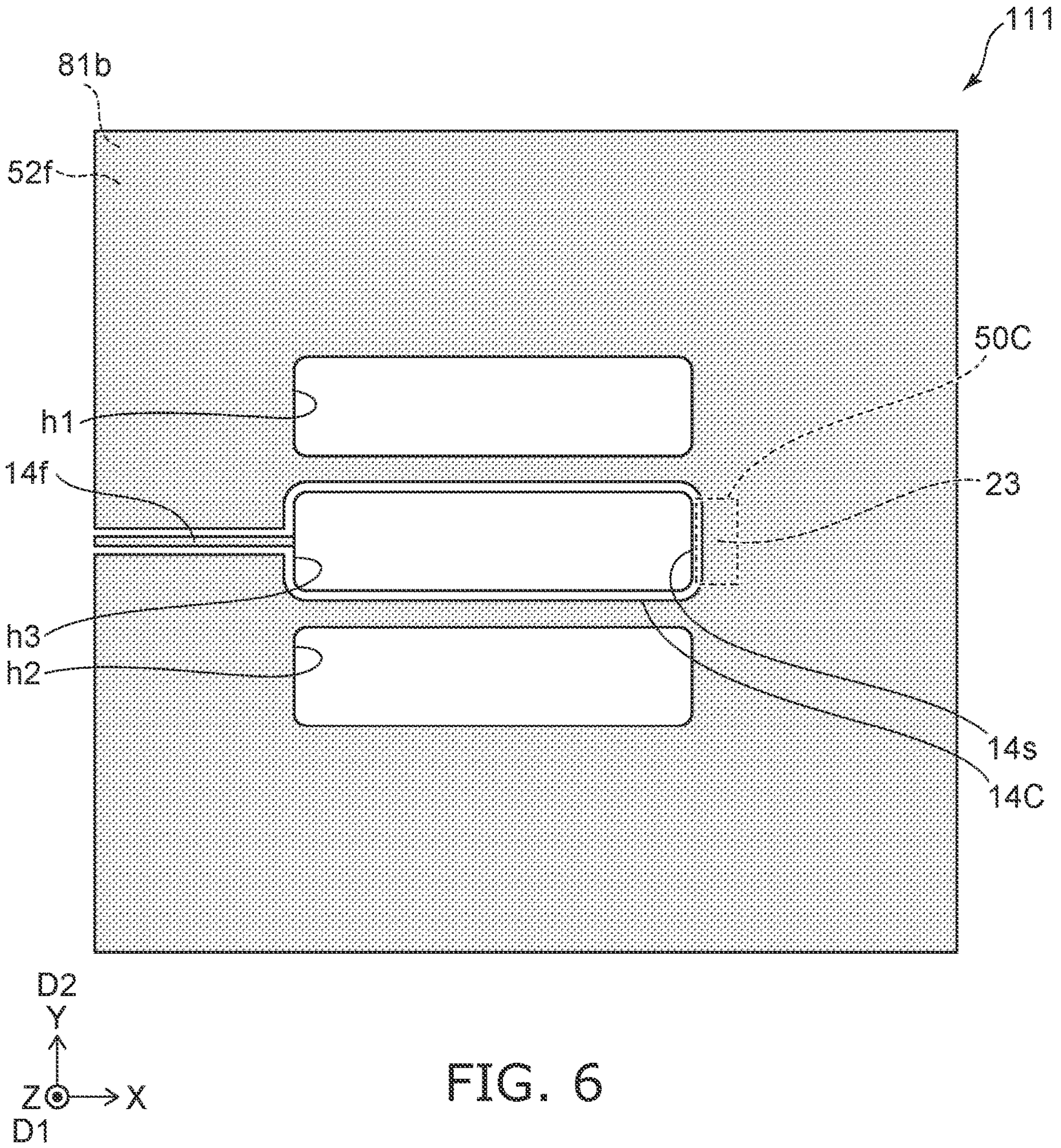
FIG. 6 is a schematic plan view illustrating the electronic circuit according to the first embodiment.

FIGS. 5 and 6 are schematic plan views illustrating an electronic circuit according to the first embodiment.

Figure 7A:
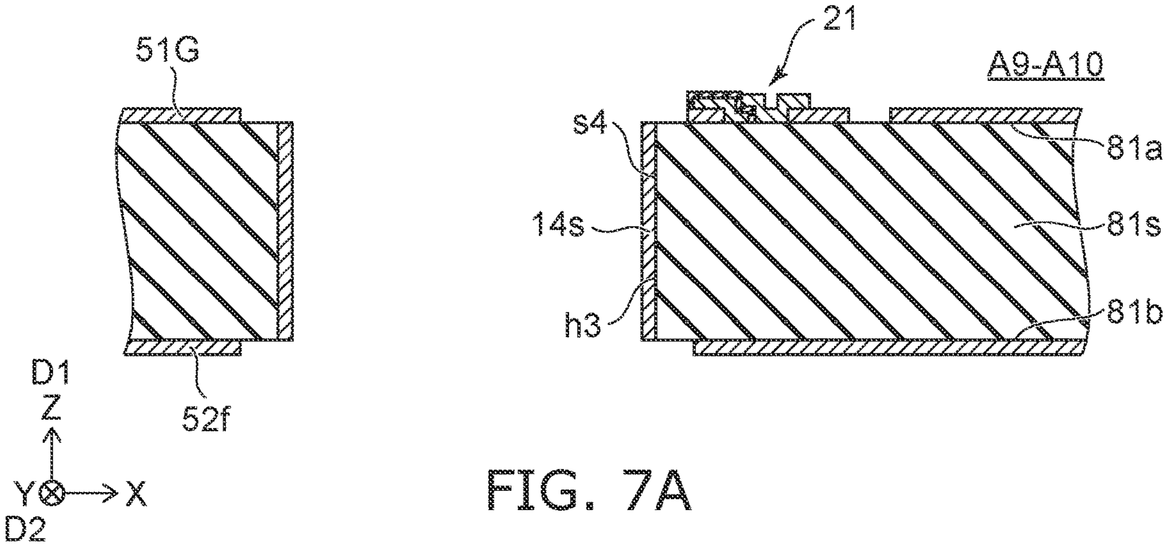
FIGS. 7A to 7C are schematic cross-sectional views illustrating the electronic circuit according to the first embodiment.
Figure 7B:
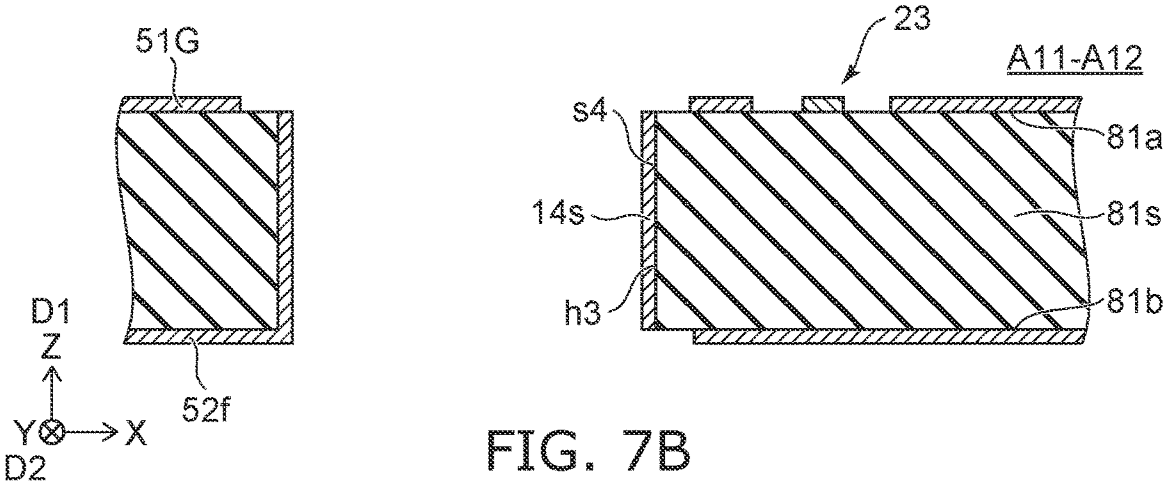
Figure 7C:
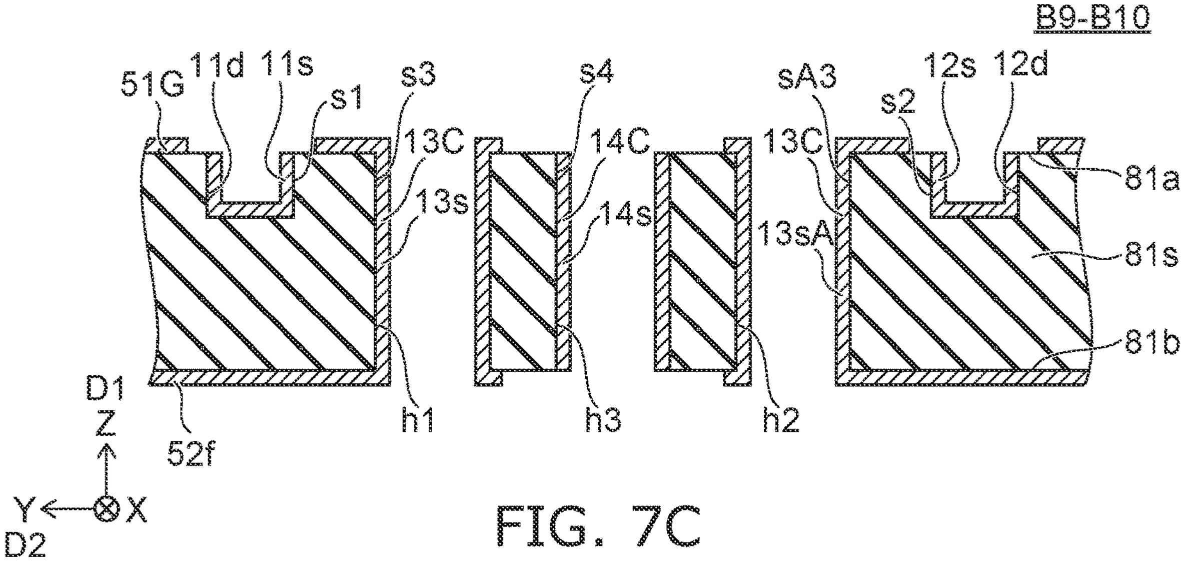

FIGS. 7A to 7C are schematic cross-sectional views illustrating the electronic circuit according to the first embodiment.

Figure 8:
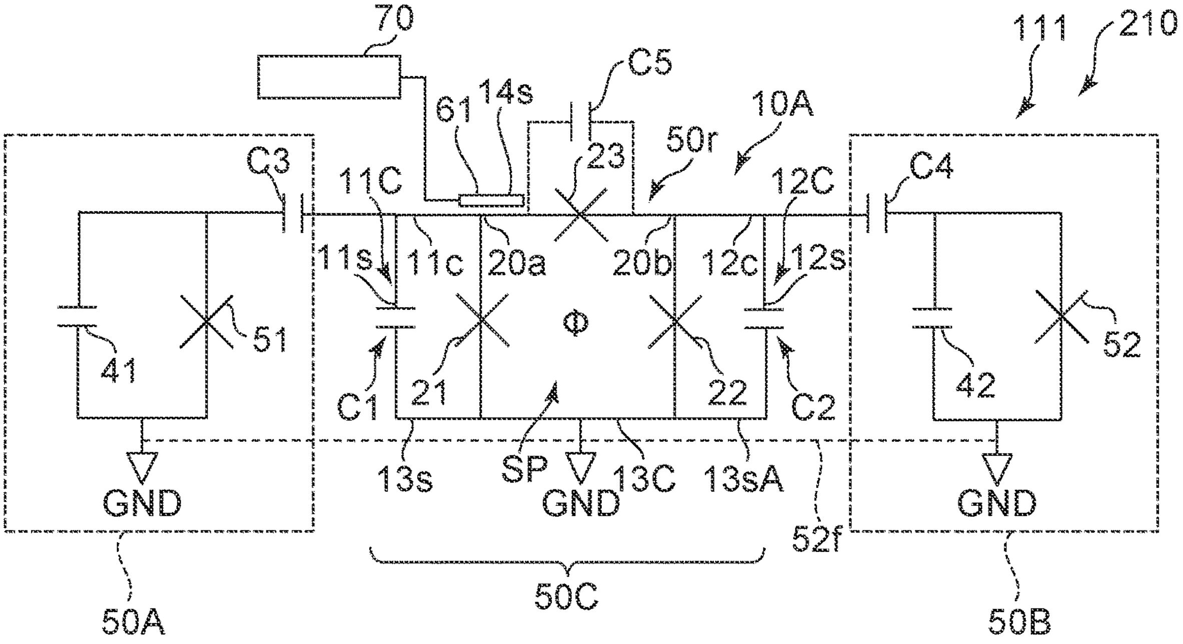
FIG. 8 is a schematic diagram illustrating the electronic circuit and a computing device according to the first embodiment.

FIG. 8 is a schematic diagram illustrating the electronic circuit and the computing device according to the first embodiment.

FIG. 5 illustrates the pattern of the conductive member on the first face 81*a* of the first base 81*s*. FIG. 6 illustrates the pattern of the conductive member on the second face 81*b* of the first base 81*s*. FIG. 6 is a transparent plan view. FIG. 7A is a cross-sectional view taken along the line A9-A10 in FIG. 5. FIG. 7B is a sectional view taken along the line A11-A12 in FIG. 5. FIG. 7C is a sectional view taken along the line B9-B10 in FIG. 5.

As shown in FIG. 5, in an electronic circuit 111 according to the embodiment, the first structure 10A includes a fourth conductive member 14C. The configuration of the electronic circuit 111 except for this may be the same as the configuration of the electronic circuit 110.

The fourth conductive member 14C includes a fourth region 14*s*. As shown in FIG. 7C, the first base 81*s* further includes a fourth side face s4. The fourth side face s4 crosses the X-Y plane. The fourth region 14*s* is provided along the fourth side face s4.

As shown in FIGS. 5, 6, and 7C, in this example, the first base 81*s* includes the first hole h1, a second hole h2, and a third hole h3. The first hole h1, the second hole h2, and the third hole h3 are connected to the first face 81*a* and the second face 81*b*. These holes penetrate the first base 81*s*. The third side face s3 is at least a part of the first hole h1. The third other side face sA3 is at least a part of the second hole h2. The fourth side face s4 is at least a part of the third hole h3.

A direction from the second region 12*s* to the first region 11*s* is defined as a second direction D2. The second direction D2 is, for example, the Y-axis direction. A position of the fourth region 14*s* in the second direction D2 (fourth side face position) is between a position of the first region 11*s* in the second direction D2 (first side face position), and a position of the second region 12*s* in the second direction D2 (second side face position).

A position of the third region 13*s* (third side face position) in the second direction D2 is between the fourth side face position and the first side face position. A position of the third other region 13*s*A (third other side face position) in the second direction D2 is between the fourth side face position and the second side face position.

For example, in the second direction D2, the fourth region 14*s* is provided between the first region 11*s* and the second region 12*s*. In the second direction D2, the third region 13*s* is provided between the fourth region 14*s* and the first region 11*s*. In the second direction D2, the third other region 13*s*A is provided between the fourth region 14*s* and the second region 12*s*.

In the electronic circuit 111 as well, the first capacitor C1 is formed by the first region 11*s* and the third region 13*s*. The second capacitor C2 is formed by the second region 12*s* and the third other region 13*s*A. The third hole h3 is provided between the third region 13*s* and the third other region 13*s*A. Thereby, crosstalk can be further reduced.

The fourth region 14*s* functions as, for example, the control conductive member 61 illustrated in FIG. 8. For example, the magnetic flux $\phi$ of the space SP in the loop 50*r* including the intermediate Josephson junction 23, the first Josephson junction 21, and the second Josephson junction 22 can be modulated by a current supplied to the fourth region 14*s*. For example, a controller 70 is coupled to the fourth region 14*s* (e.g., control conductive member 61). The controller 70 is configured to supply a control current (for example, a signal) to the fourth region 14*s* (for example, the control conductive member 61). By a control operation of the controller 70, the coupling state of the first structure 10A (coupler) can be controlled. Control of the coupling state includes control of coupling strength. For example, control of two qubits can be performed.

As shown in FIG. 6, a control conductive film 14*f* may be provided on the second face 81*b*. The control conductive film 14*f* is electrically connected to the fourth region 14*s*. The control conductive film 14*f* may be included in the fourth conductive member 14C. The controller 70 (see FIG. 8) may supply a current to the fourth region 14*s* via the control conductive film 14*f*.

As shown in FIG. 8, the computing device 210 according to the embodiment may include the electronic circuit 111 and the controller 70.

Figure 9:
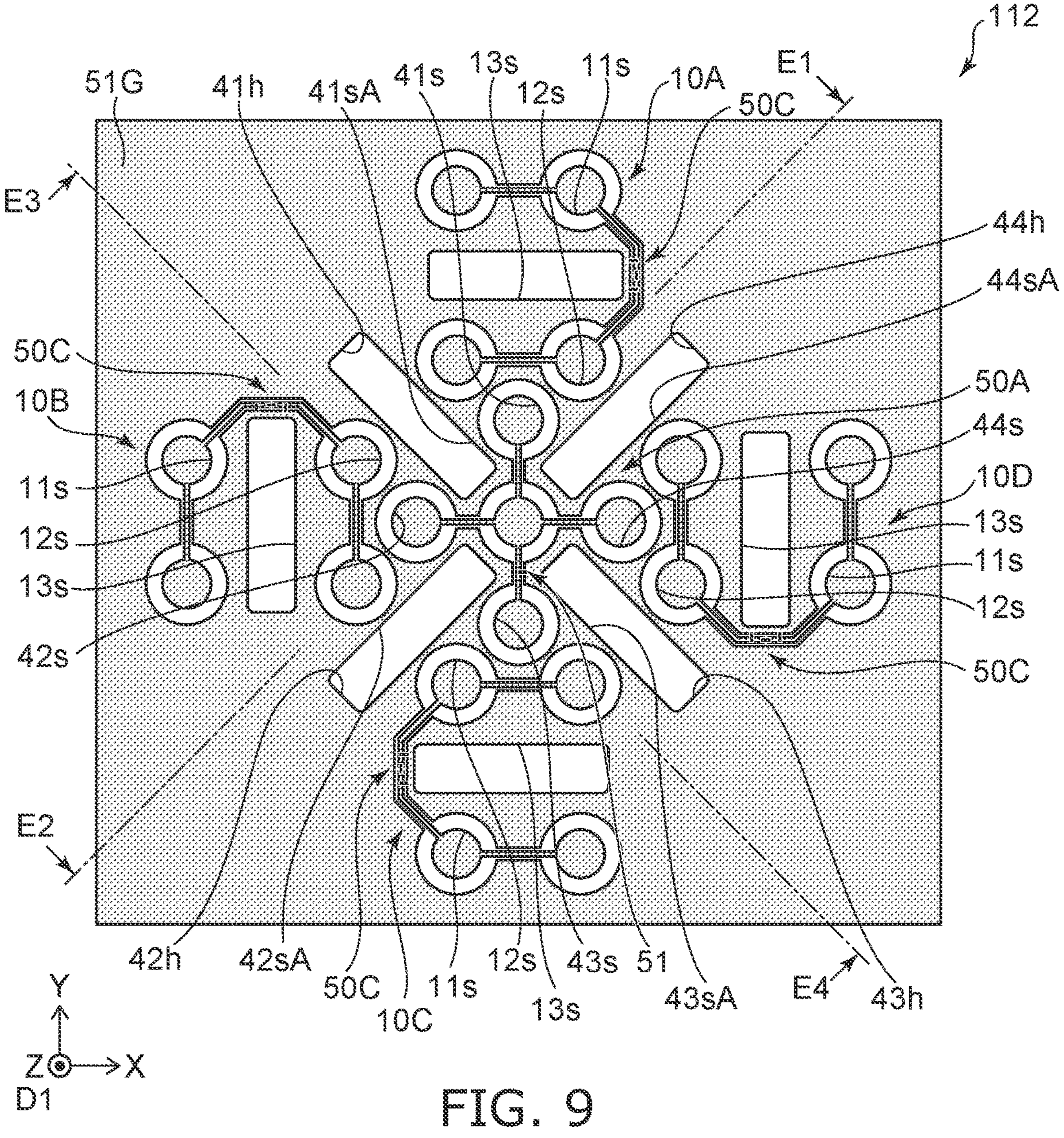
FIG. 9 is a schematic plan view illustrating an electronic circuit according to the first embodiment.

FIG. 9 is a schematic plan view illustrating an electronic circuit according to the first embodiment.

Figure 10:
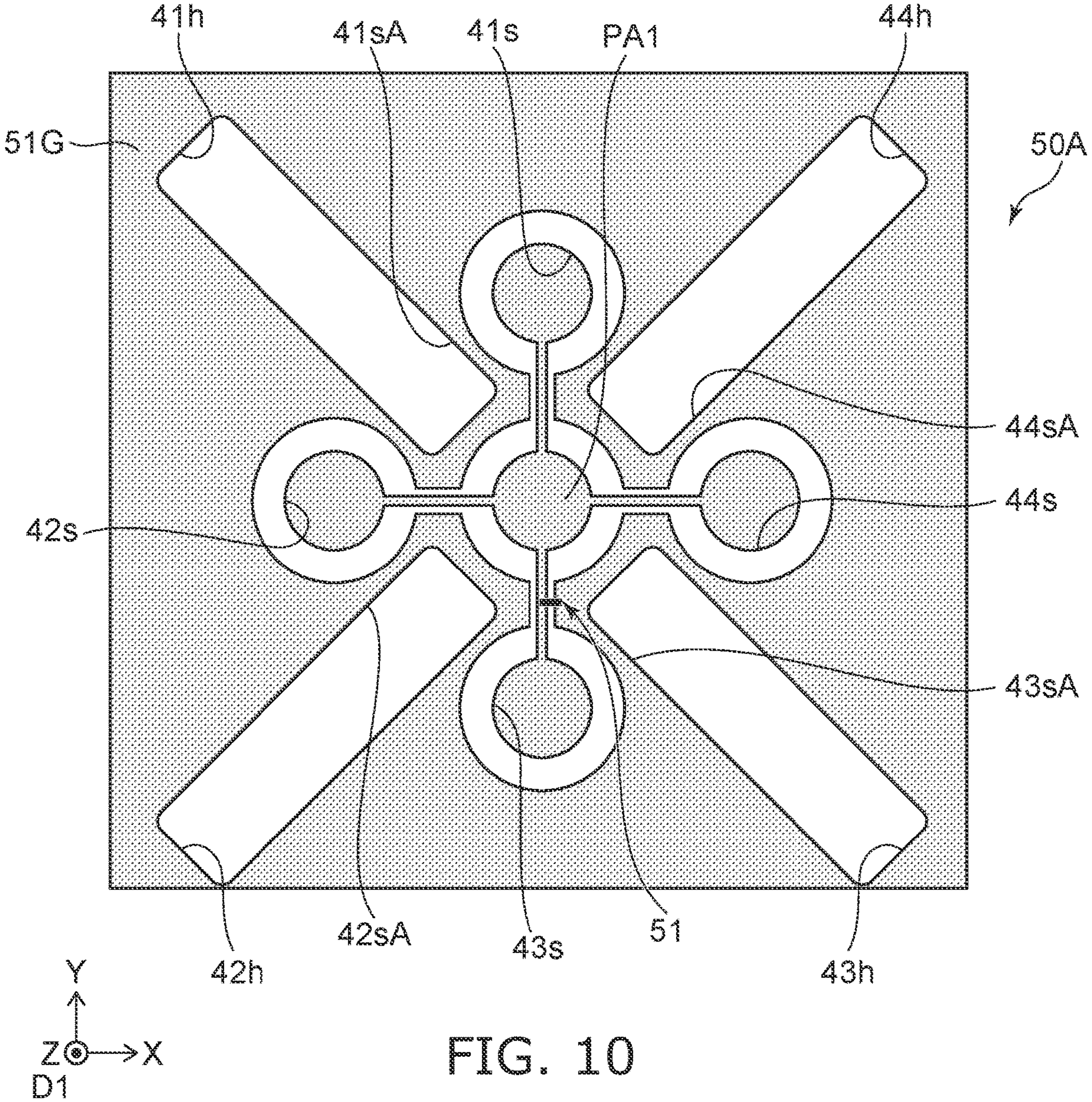
FIG. 10 is a schematic plan view illustrating a part of the electronic circuit according to the first embodiment.

FIG. 10 is a schematic plan view illustrating a part of the electronic circuit according to the first embodiment.

Figure 11A:
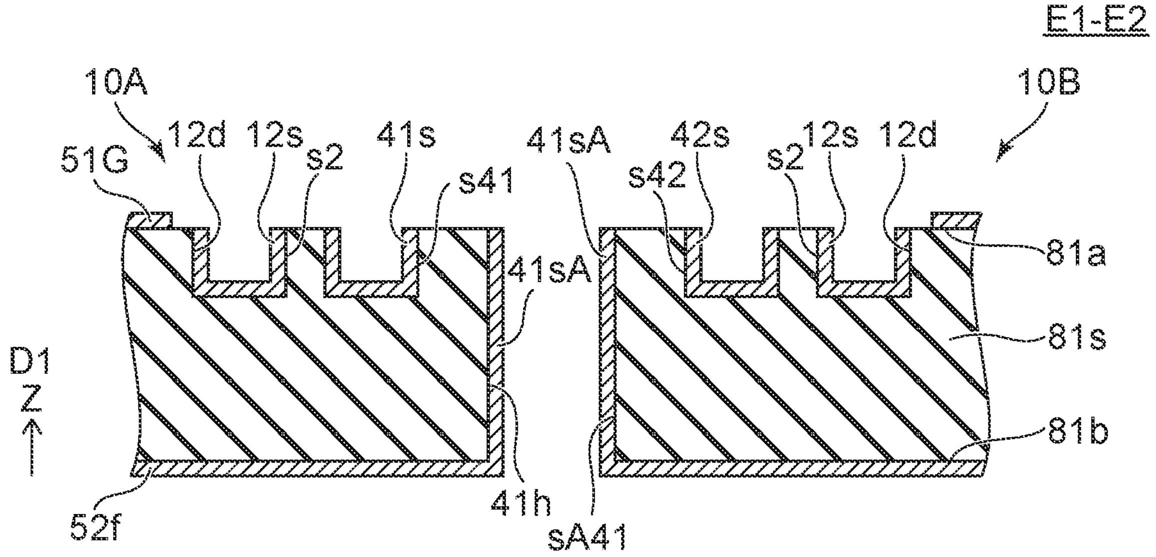
FIGS. 11A and 11B are schematic cross-sectional views illustrating the electronic circuit according to the first embodiment.
Figure 11B:
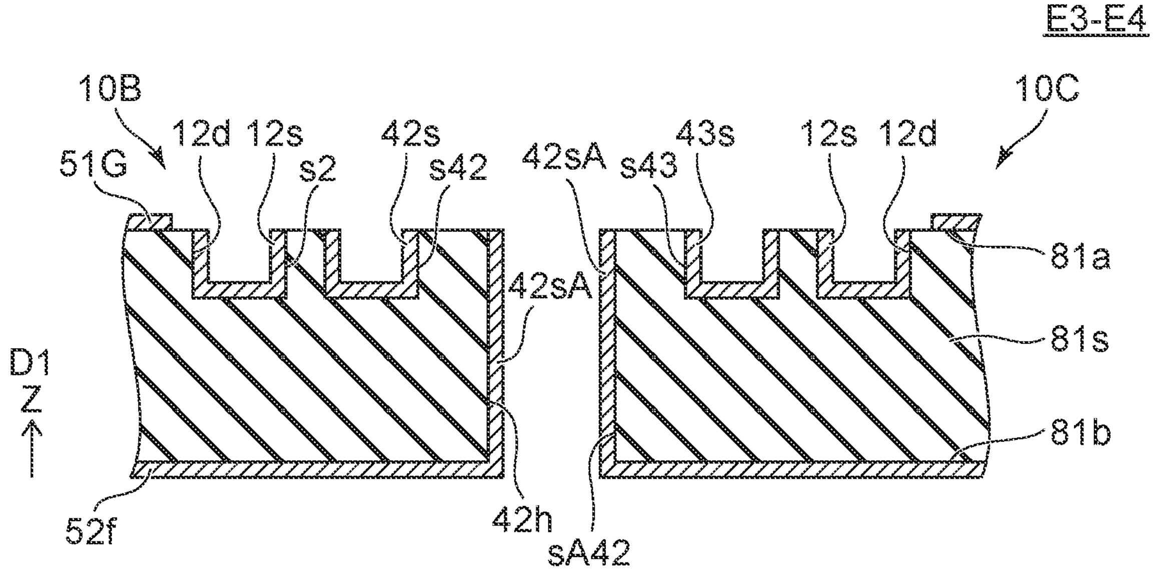

FIGS. 11A and 11B are schematic cross-sectional views illustrating the electronic circuit according to the first embodiment.

Figure 12:
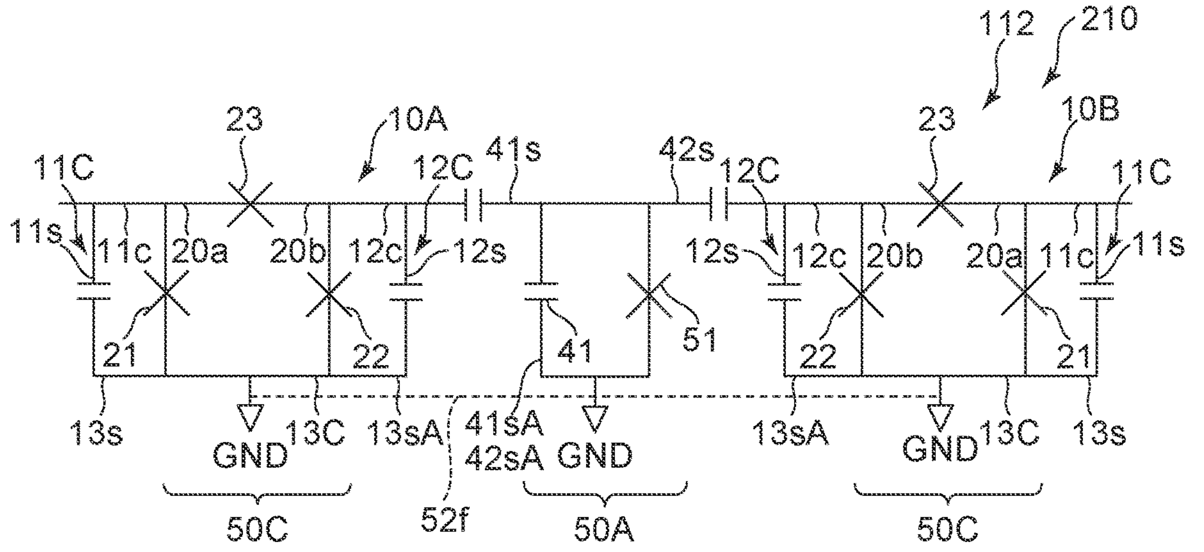
FIG. 12 is a schematic diagram illustrating the electronic circuit and a computing device according to the first embodiment.

FIG. 12 is a schematic diagram illustrating the electronic circuit and the computing device according to the first embodiment.

FIG. 10 illustrates a part of FIG. 9. FIG. 11A is a cross-sectional view taken along the line E1-E2 in FIG. 9. FIG. 11B is a sectional view taken along the line E3-E4 in FIG. 9.

As shown in FIG. 9, an electronic circuit 112 according to the embodiment further includes the first element structure 50A in addition to the first structure 10A. The configuration of the electronic circuit 112 except for this may be the same as the configuration of the electronic circuit 110.

The first element structure 50A includes the first element Josephson junction 51, the first element region 41*s*, and a first element opposing region 41*s*A. The first element region 41*s* is connected to the first element Josephson junction 51.

As shown in FIG. 11A, the first base 81*s* further includes a first element side face s41 and a first element opposing side face sA41. The first element side face s41 and the first element opposing side face sA41 cross the X-Y plane. The first element region 41*s* is provided along the first element side face s41. The first element opposing region 41*s*A is provided along the first element opposing side face sA41. The first element opposing region 41*s*A is electrically connected to the third region 13*s*. For example, the first element opposing region 41*s*A is electrically connected to the second face conductive film 52*f*. As already explained, the third region 13*s* is electrically connected to the second face conductive film 52*f*. The first element opposing region 41*s*A is electrically connected to the third region 13*s* via the second face conductive film 52*f*. The first element opposing region 41*s*A can be set to a fixed potential (e.g., ground potential), for example.

The first element region 41*s* can be coupled with one of the first conductive member 11C and the second conductive member 12C. In this example, the first element region 41*s* can be coupled with the second conductive member 12C.

As shown in FIG. 9, in this example, in the electronic circuit 112, the first element structure 50A includes the first element Josephson junction 51, the first element region 41*s*, the second element region 42*s*, and the first element opposing region 41*s*A, and a second element opposing region 42*s*A. The first element region 41*s* is connected to the first element Josephson junction 51. The second element region 42*s* is connected to the first element Josephson junction 51. The first element structure 50A may further include a third element region 43*s* and a fourth element region 44*s*.

As shown in FIGS. 11A and 11B, the first base 81*s* includes the first element side face s41, a second element side face s42, the first element opposing side face sA41, and a second element opposing side face sA42. The first element side face s41, the second element side face s42, the first element opposing side face sA41, and the second element opposing side face sA42 cross the X-Y plane. The first element region 41*s* is provided along the first element side face s41. The second element region 42*s* is provided along the second element side face s42. The first element opposing region 41sA is provided along the first element opposing side face sA41. The second element opposing region 42sA is provided along the second element opposing side face sA42.

A plurality of first structures (in this example, a first structure 10A, a first structure 10B, a first structure 10C, and a first structure 10D) are provided. The first element opposing region 41sA is electrically connected to the third region 13s included in one of the plurality of first structures (first structure 10A) (see FIG. 12). The second element opposing region 42sA is electrically connected to the third region 13s included in another one of the plurality of first structures (first structure 10B) (see FIG. 12). These electrical connections are made, for example, via the second face conductive film 52f.

The first element region 41s can be coupled with one of the first conductive member 11C and the second conductive member 12C included in one of the plurality of first structures (for example, the first structure 10A). In this example, the first element region 41s can be coupled with the second conductive member 12C (second element portion 20b) included in the first structure 10A (see FIG. 12).

The second element region 42s can be coupled with one of the first conductive member 11C and the second conductive member 12C included in another one of the plurality of first structures (for example, the first structure 10B). In this example, the second element region 42s can be coupled with the second conductive member 12C (second element portion 20b) included in the first structure 10B (see FIG. 12).

For example, the first element structure 50A is provided between a plurality of first structures (first structure 10A, first structure 10B, etc.).

A capacitor element is formed by the first element region 41s and the first element opposing region 41sA. A capacitor element is formed by the second element region 42s and the second element opposing region 42sA. A capacitor element is formed by the third element region 43s and the third element opposing region 43sA. A capacitor element is formed by the fourth element region 44s and the fourth element opposing region 44sA.

For example, the first intermediate hole 41h, a second intermediate hole 42h, a third intermediate hole 43h, a fourth intermediate hole 44h, etc. may be provided in the first base 81s. The first element opposing region 41sA is provided along the side face of the first intermediate hole 41h. The second element opposing region 42sA is provided along the side face of the second intermediate hole 42h. The third element opposing region 43sA is provided along the side face of the third intermediate hole 43h. The fourth element opposing region 44sA is provided along the side face of the fourth intermediate hole 44h.

Thus, the first base 81s further includes the first intermediate hole 41h including the first element opposing side face sA41, and the second intermediate hole 42h including the second element opposing side face sA42 (FIGS. 11A and 11B). At least a part of at least one of the first intermediate hole 41h or the second intermediate hole 42h is provided between the first element region 41s and the second element region 42s. By providing such a hole, crosstalk can be further suppressed. For example, at least a part of the first intermediate hole 41h is provided between the second region 12s of one of the plurality of structures (the first structure 10A) and the second region 12s of another one of the plurality of structures (the first structure 10B). and the second region 12s. By providing such a hole, crosstalk between one of the plurality of structures and the other one of the plurality of structures is suppressed.

As shown in FIG. 10, a pad portion PA1 may be provided in the first element structure 50A. Coupling (or connection) may be performed via the pad portion PA1. As shown in FIG. 12, the computing device 210 according to the embodiment includes the electronic circuit 112.

Figure 13:
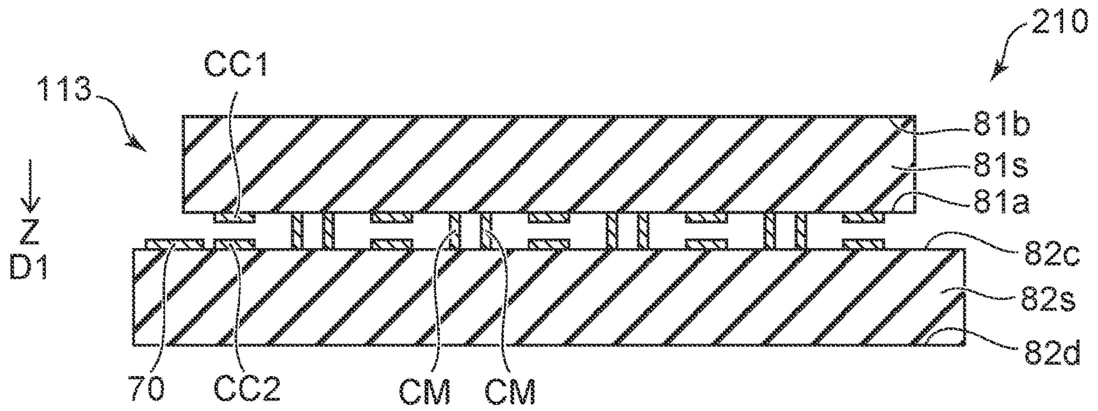
FIG. 13 is a schematic cross-sectional view illustrating an electronic circuit according to the first embodiment.

FIG. 13 is a schematic cross-sectional view illustrating an electronic circuit according to the first embodiment.

Figure 14:
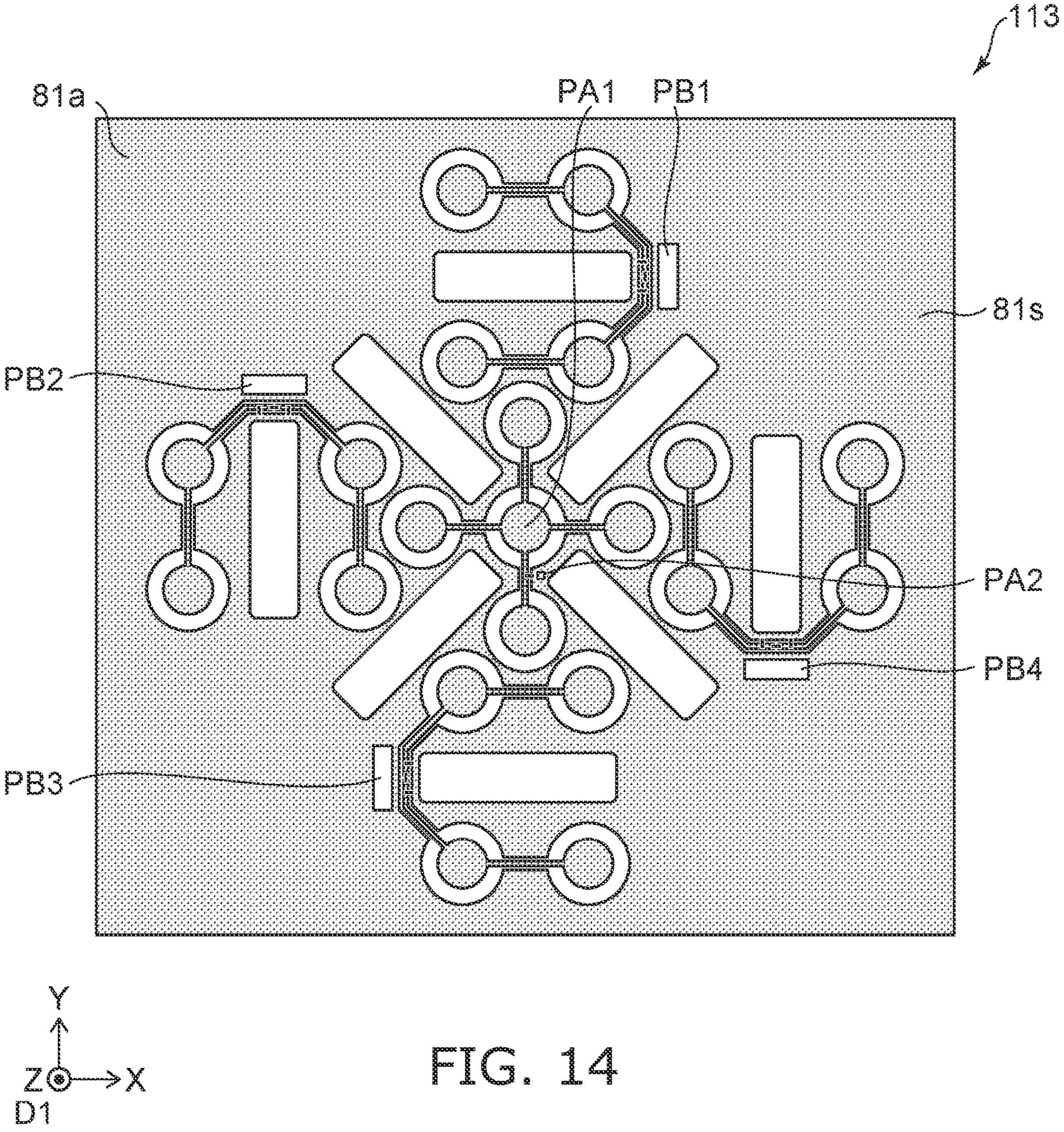
FIG. 14 is a schematic plan view illustrating the electronic circuit according to the first embodiment.
Figure 15:
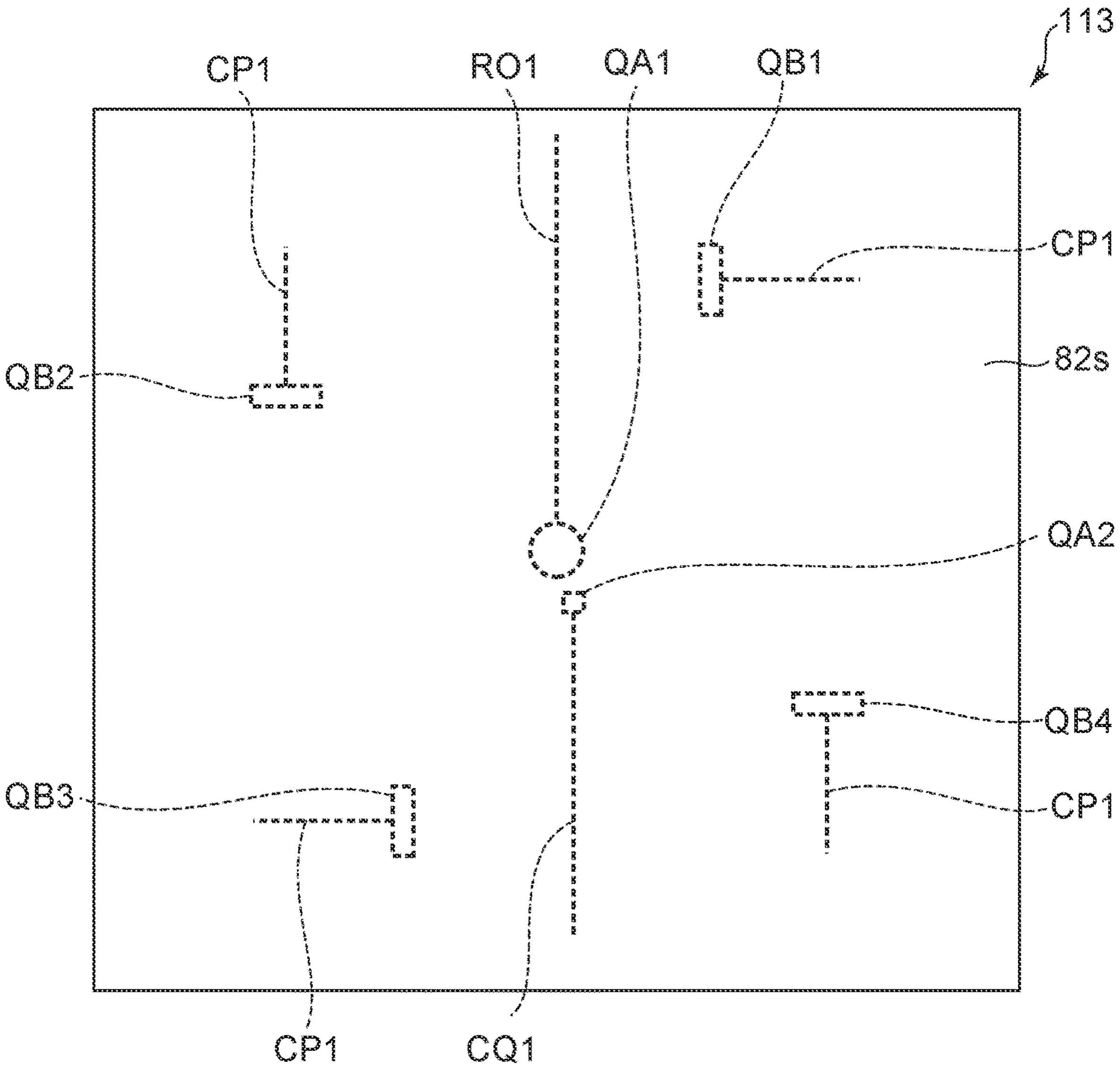
FIG. 15 is a schematic plan view illustrating the electronic circuit according to the first embodiment.

FIGS. 14 and 15 are schematic plan views illustrating the electronic circuit according to the first embodiment.

As shown in FIG. 13, the computing device 210 according to the embodiment includes an electronic circuit 113 including the first base 81s, the controller 70, and the second base 82s. The controller 70 is provided on the second base 82s. At least a part of the second base 82s overlaps the first base 81s.

In this example, the second base 82s includes a third face 82c and a fourth face 82d. The third face 82c is located between the fourth face 82d and the first face 81a. The third face 82c faces the first face 81a. In this example, the controller 70 is provided on the third face 82c. In the embodiment, the controller 70 may be provided on the fourth face 82d.

As shown in FIG. 13, in this example, a first base conductive film CC1 is provided on the first face 81a of the first base 81s. A second base conductive film CC2 is provided on the second base 82s. The second base conductive film CC2 faces the first base conductive film CC1. The second base conductive film CC2 is provided on the third face 82c. In this example, a plurality of first base conductive films CC1 and a plurality of second base conductive films CC2 are provided. One of the plurality of second base conductive films CC2 faces one of the plurality of first base conductive films CC1. The first base conductive film CC1 can be electromagnetically coupled with the second base conductive film CC2. The first base conductive film CC1 and the second base conductive film CC2 can be capacitively coupled. The coupling transmits an alternating current signal. A gap may be provided between the first base conductive film CC1 and the second base conductive film CC2.

As shown in FIG. 13, a connecting member CM may be provided. The connecting member CM electrically connects the conductive member provided on the first base 81s and the conductive member provided on the second base 82s. A plurality of connecting members CM may be provided. One of the plurality of connecting members CM electrically connects one of the plurality of conductive members provided on the first base 81s and one of the plurality of conductive members provided on the second base 82s.

FIG. 14 illustrates the electronic circuit 113. In the electronic circuit 113, pad portions PA1, PA2, PB1, PB2, PB3, and PB4 are provided. A part of these pad portions and the plurality of first structures 10A are connected. Another part of these pad portions is connected to the first element structure 50A. The configuration of electronic circuit 113 is similar to the configuration of electronic circuit 112 except for these pad portions. The pad portions PA1, PA2, PB1, PB2, PB3, and PB4 correspond to the first base conductive film CC1.

FIG. 15 illustrates a conductive pattern provided on the second base 82s. In this example, a coupler control line CP1, a qubit control line CQ1, and a read resonator RO1 are provided. In this example, a plurality of coupler control lines CP1 are provided. One of the plurality of coupler control lines CP1 is electrically connected to the pad portion QB1. Another one of the plurality of coupler control lines CP1 is electrically connected to the pad portion QB2. Another one of the plurality of coupler control lines CP1 is electrically connected to the pad portion QB3. Another one of the plurality of coupler control lines CP1 is electrically connected to the pad portion QB4. The qubit control line CQ1 is electrically connected to the pad portion QA2. The read resonator RO1 is electrically connected to the pad portion QA2. The pad portions QA1, QA2, QB1, QB2, QB3, and QB4 correspond to the second base conductive film CC2.

The pad portion PA1 and the pad portion QA1 are coupled. The pad portion PA2 and the pad portion QA2 are coupled. The pad portion PB1 and the pad portion QB1 are coupled. The pad portion PB2 and the pad portion QB2 are coupled. The pad portion PB3 and the pad portion QB3 are coupled. The pad portion PB4 and the pad portion QB4 are coupled.

Figure 16:
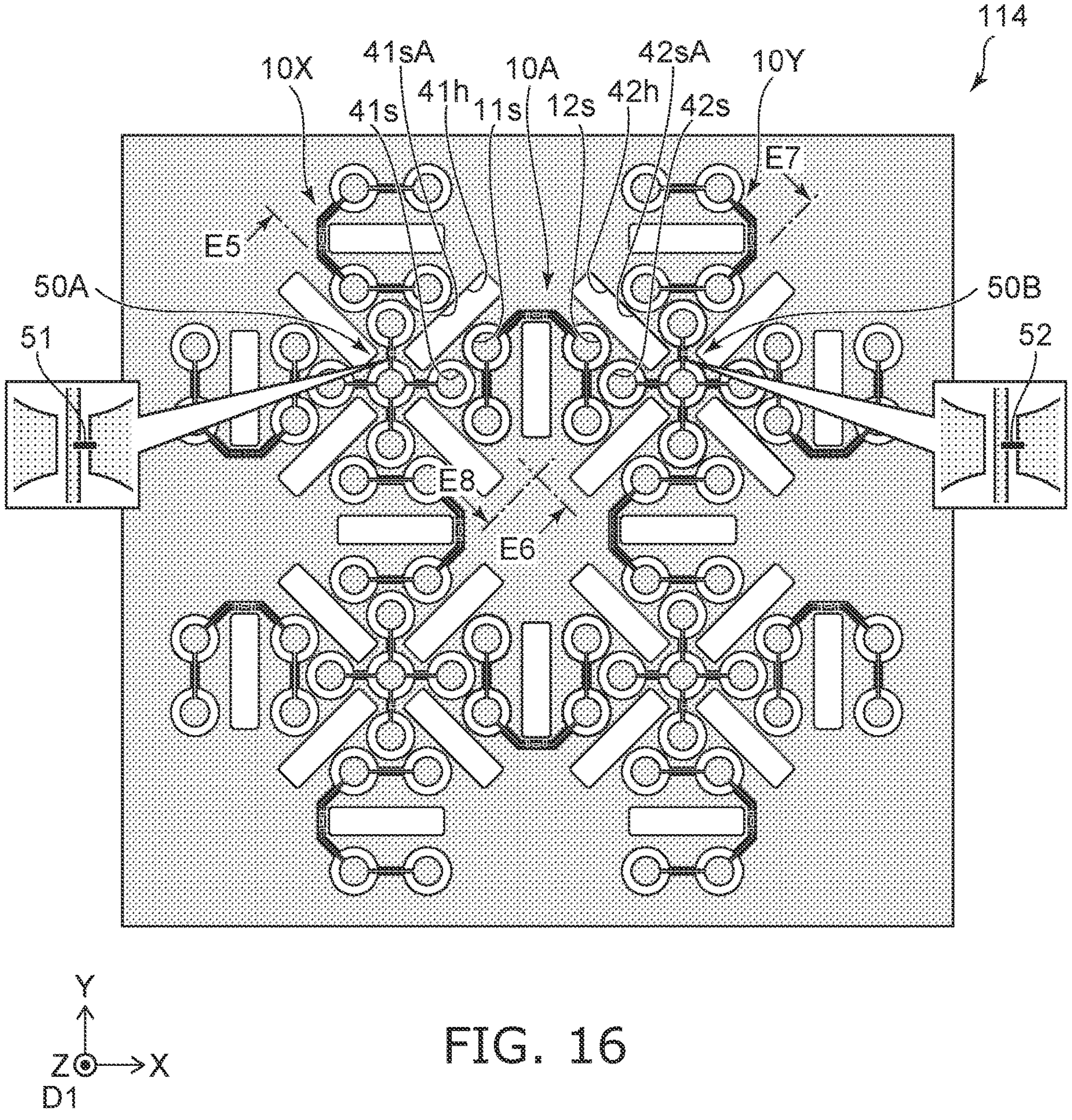
FIG. 16 is a schematic plan view illustrating an electronic circuit according to the first embodiment.

FIG. 16 is a schematic plan view illustrating an electronic circuit according to the first embodiment.

Figure 17A:
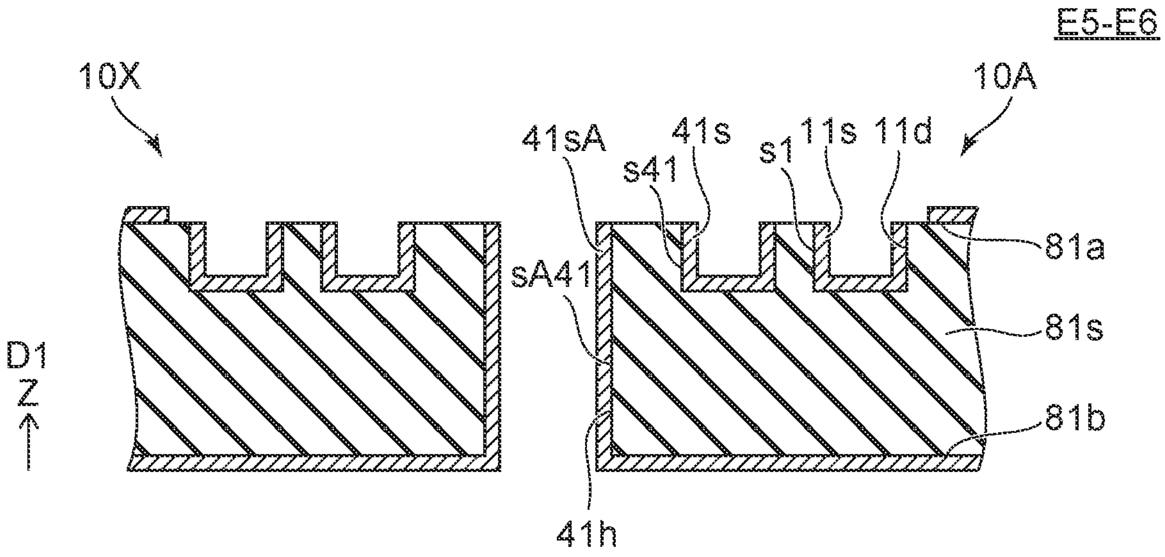
FIGS. 17A and 17B are schematic cross-sectional views illustrating the electronic circuit according to the first embodiment.
Figure 17B:
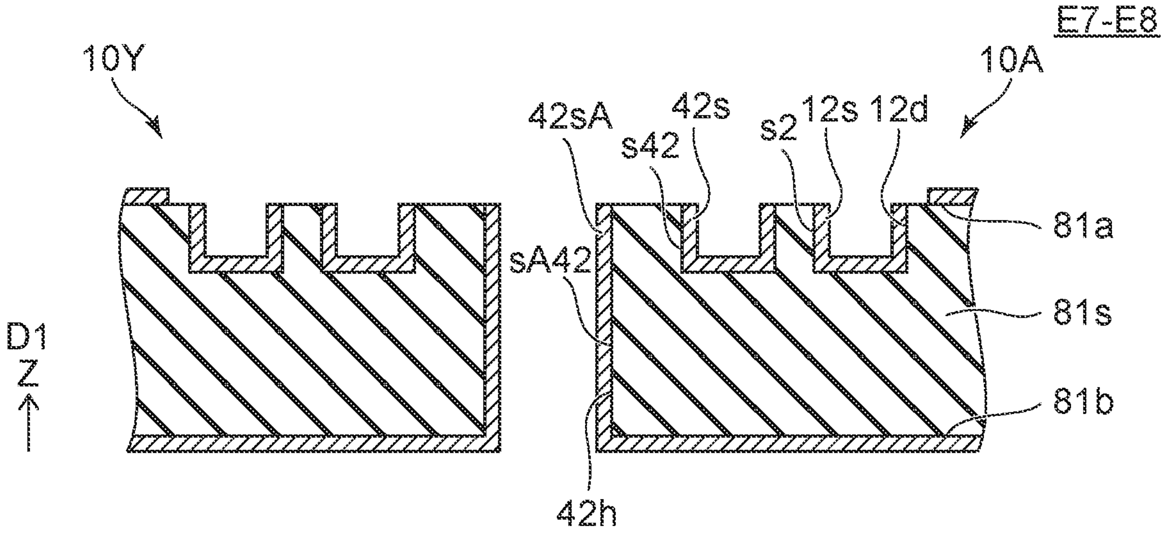

FIGS. 17A and 17B are schematic cross-sectional views illustrating the electronic circuit according to the first embodiment.

Figure 18:
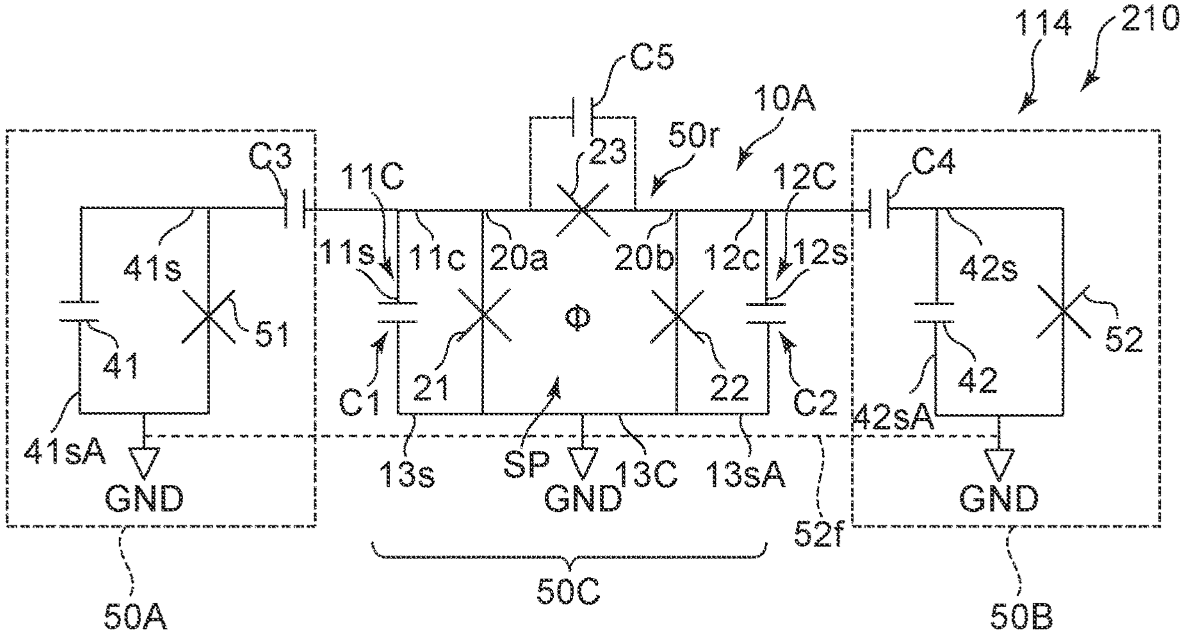
FIG. 18 is a schematic diagram illustrating the electronic circuit and a computing device according to the first embodiment.

FIG. 18 is a schematic diagram illustrating the electronic circuit and a computing device according to the first embodiment.

FIG. 17A is a cross-sectional view taken along the line E5-E6 in FIG. 16. FIG. 17B is a sectional view taken along the line E7-E8 in FIG. 16.

As shown in FIG. 16, an electronic circuit 114 according to the embodiment includes the first element structure 50A and the second element structure 50B in addition to the first structure 10A. The configuration of the first structure 10A in the electronic circuit 114 may be the same as the configuration of the first structure 10A in the electronic circuit 110.

The first element structure 50A includes the first element Josephson junction 51, the first element region 41*s*, and the first element opposing region 41*s*A. The first element region 41*s* is connected to the first element Josephson junction 51.

The second element structure 50B includes the second element Josephson junction 52, the second element region 42*s*, and the second element opposing region 42*s*A. The second element region 42*s* is connected to the second element Josephson junction 52.

As shown in FIGS. 17A and 17B, the first base 81*s* includes the first element side face s41, the first element opposing side face sA41, the second element side face s42, and the second element opposing side face sA42. The first element side face s41, the first element opposing side face sA41, the second element side face s42, and the second element opposing side face sA42 cross the X-Y plane. The first element region 41*s* is provided along the first element side face s41. The first element opposing region 41*s*A is provided along the first element opposing side face sA41. The second element region 42*s* is provided along the second element side face s42. The second element opposing region 42*s*A is provided along the second element opposing side face sA42.

The first element region 41*s* can be coupled with the first conductive member 11C (for example, the first region 11*s*) (see FIG. 18). The second element region 42*s* can be coupled with the second conductive member 12C (for example, the second region 12*s*) (see FIG. 18). For example, the third capacitor C3 is formed by the first element region 41*s* and the first region 11*s*. The fourth capacitor C4 is formed by the second element region 42*s* and the second region 12*s*.

The first structure 10A can be coupled with the first element structure 50A. The first structure 10A can be coupled with the second element structure 50B. A high-density electronic circuit is obtained. Crosstalk is suppressed. Electronic circuits and computing devices whose characteristics can be improved can be provided.

As shown in FIG. 16, in the electronic circuit 114, another first structure 10*x*, still another first structure 10Y, etc. may be provided.

Figure 19:
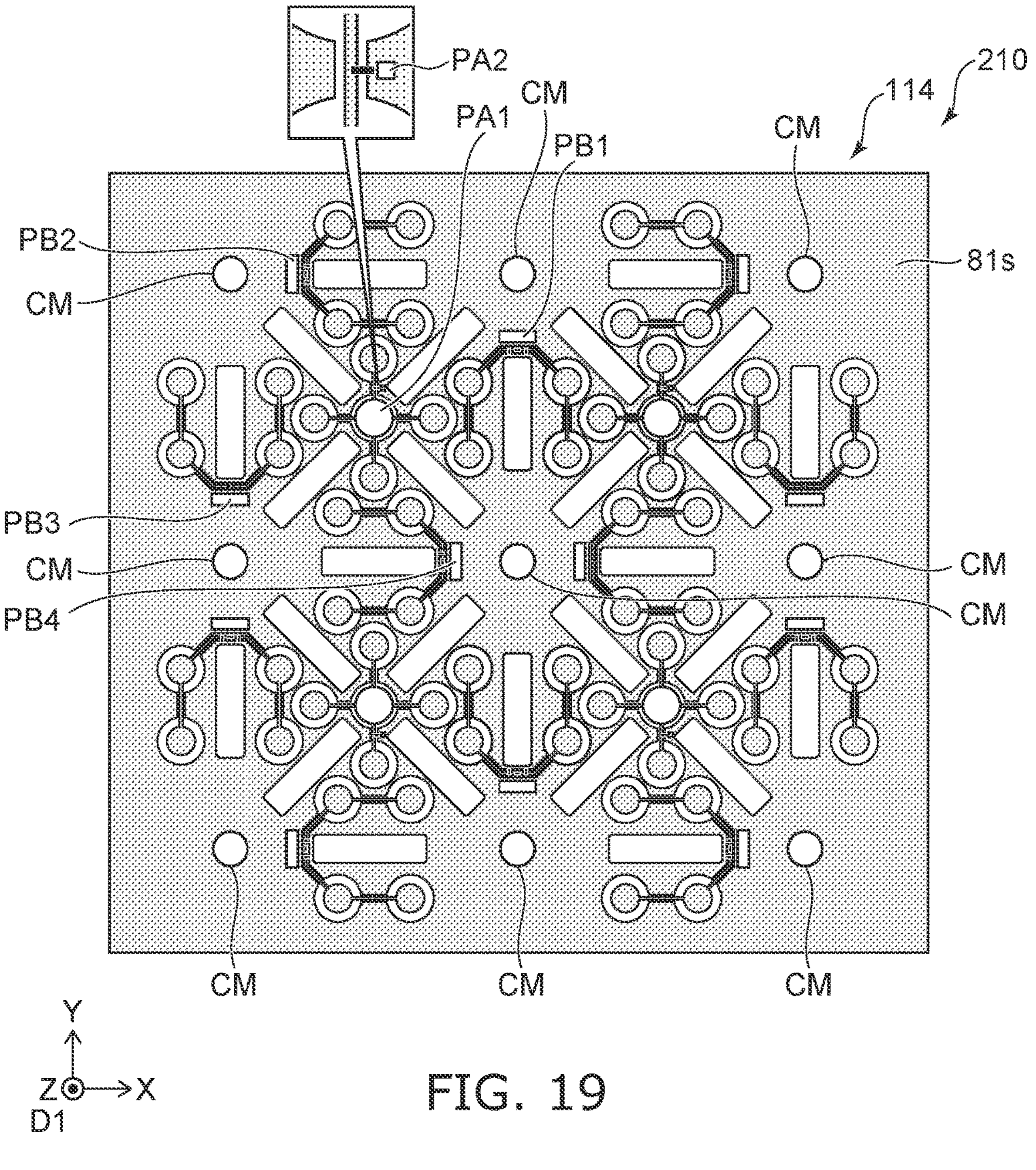
FIG. 19 is a schematic plan view illustrating an electronic circuit according to the first embodiment.
Figure 20:
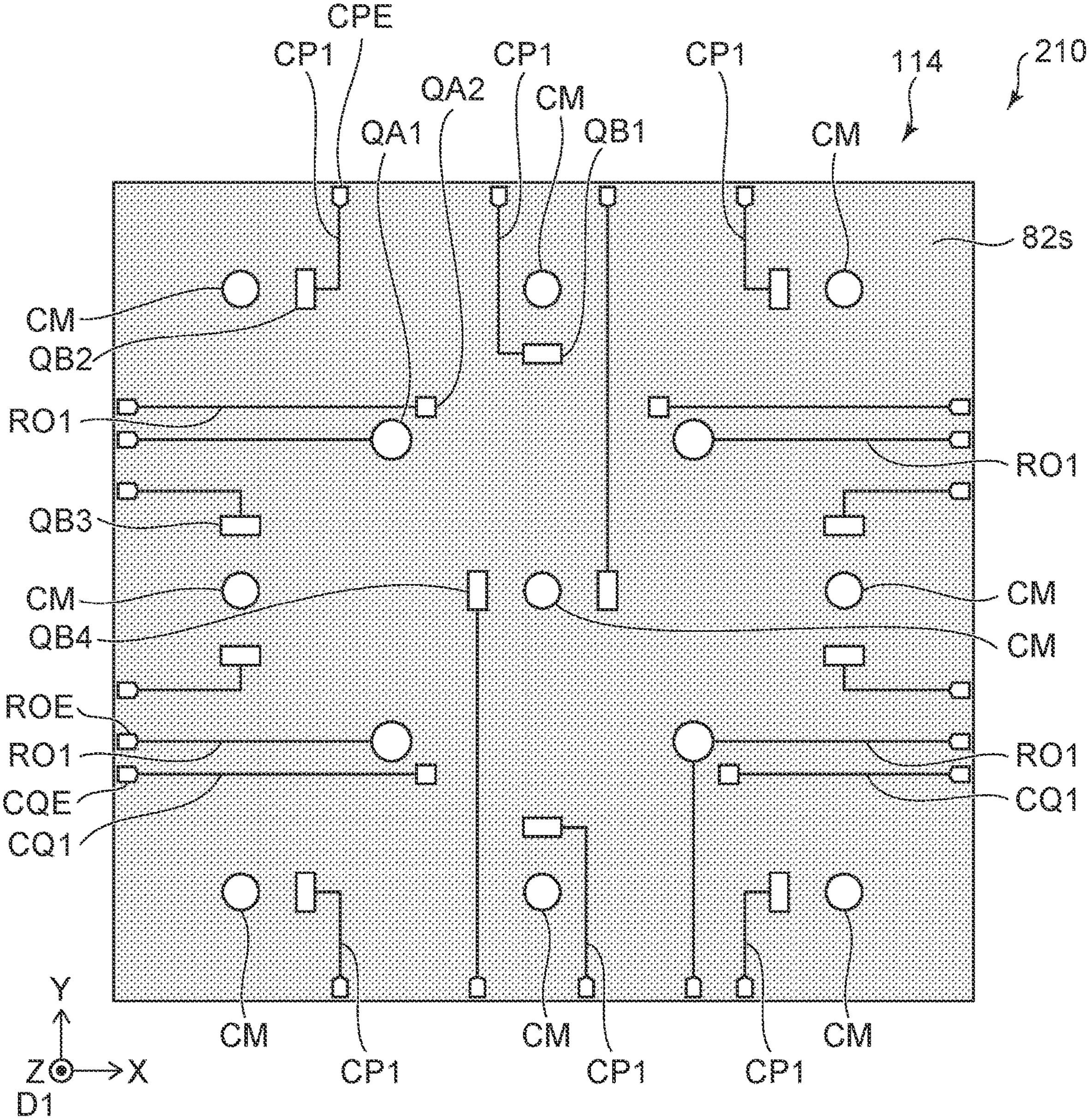
FIG. 20 is a schematic plan view illustrating the electronic circuit according to the first embodiment.

FIGS. 19 and 20 are schematic plan views illustrating the electronic circuit according to the first embodiment.

The electronic circuit 114 (or the computing device 210) may include the first base 81*s* and the second base 82*s*. FIG. 19 illustrates the first base 81*s*. FIG. 20 illustrates the second base 82*s*. The second base 82*s* overlaps the first base 81*s*.

The pad portions PA1, PA2, PB1, PB2, PB3, and PB4 are coupled to the pad portions QA1, QA2, QB1, QB2, QB3, and QB4 through connection portions. The coupler control line CP1 is electrically connected to a coupler control electrode CPE. The qubit control line CQ1 is electrically connected to qubit control electrode CQE. The read resonator RO1 is electrically connected to a read resonator electrode ROE.

Second Embodiment

The second embodiment relates to a computing device. The computing device 210 (see FIG. 1 etc.) includes the electronic circuit and the controller 70 according to the embodiment. The controller 70 is configured to, for example, supply a signal to the fourth conductive member 14C. A computing device capable of improving properties is provided.

The embodiments may include the following configuration (Technical proposals).

(Configuration 1)

An electronic circuit, comprising:

a first base; and a first structure, the first base including a first face, a first side face, a second side face, a third side face, and a third other side face, the first side face, the second side face, the third side face, and the third other side face crossing a plane along the first face, the first structure including a first nonlinear element, a first conductive member, a second conductive member, and a third conductive member, the first nonlinear element including a first element portion, a second element portion, and an intermediate Josephson junction provided between the first element portion and the second element portion, the first conductive member including a first region and a first connection region, the first region being provided along the first side face, a part of the first connection region being electrically connected to the first region, another part of the first connection region being electrically connected to the first element portion, the second conductive member including a second region and a second connection region, the second region being provided along the second side face, a part of the second connection region being electrically connected to the second region, another part of the second connection region being electrically connected to the second element portion, and the third conductive member including a third region and a third other region, the third region being provided along the third side face, the third other region being provided along the third other side face, a direction from the first region to the third region being along the plane, a direction from the second region to the third other region being along the plane.

(Configuration 2)

The electronic circuit according to Configuration 1, wherein a third region length of the third region in a first direction is longer than a first region length of the first region in the first direction, the first direction is perpendicular to the first face, and a third other region length of the third other region in the first direction is longer than a second region length of the second region in the first direction.

(Configuration 3)

The electronic circuit according to Configuration 2, wherein the third region length is not less than 2 times and not more than 350 times the first region length, and the third other region length is not less than 2 times and not more than 350 times the second region length.

(Configuration 4)

The electronic circuit according to Configuration 2, wherein the third region length is not less than 100 μm and not more than 700 μm, the first region length is not less than 2 μm and not more than 80 μm, the third other region length is not less than 100 μm and not more than 700 μm, and, the second region length is not less than 20 μm and not more than 80 μm.

(Configuration 5)

The electronic circuit according to any one of Configurations 2-4, wherein the first base further includes a second face, a direction from the second face to the first face is along the first direction, and the first base includes a first recess including the first side face and a second recess including the second side face.

(Configuration 6)

The electronic circuit according to Configuration 5, wherein the first base includes a first hole connected to the first face and the second face, the third side face is a part of the first hole, and the third other side face is another part of the first hole.

(Configuration 7)

The electronic circuit according to Configuration 5 or 6, wherein the first structure further includes a second face conductive film provided along the second face, and the third conductive member is electrically connected to the second face conductive film.

(Configuration 8)

The electronic circuit according to any one of Configurations 1-7, wherein a first capacitor is formed by the first region and the third region, a second capacitor is formed by the second region and the third other region, and the third conductive member is configured to be set to a fixed potential.

(Configuration 9)

The electronic circuit according to any one of Configurations 1-8, wherein the first nonlinear element further includes a first Josephson junction and a second Josephson junction, an end of the first Josephson junction is electrically connected to the first element portion, another end of the first Josephson junction is electrically connected to the third region, an end of the second Josephson junction is electrically connected to the second element portion, and another end of the second Josephson junction is electrically connected to the third other region.

(Configuration 10)

The electronic circuit according to Configuration 9, wherein the first Josephson junction and the second Josephson junction are provided at the first face.

(Configuration 11)

The electronic circuit according to Configuration 1, wherein the first structure further includes a fourth conductive member including a fourth region, the first base further includes a fourth side face, the fourth side face crosses the plane, and the fourth region is provided along the fourth side face.

(Configuration 12)

The electronic circuit according to Configuration 11, wherein a fourth side face position of the fourth region in a second direction from the second region to the first region is between a first side face position of the first region in the second direction and a second side face position of the second region in the second direction, a third side face position of the third region in the second direction is between the fourth side face position and the first side face position, and a third other side face position of the third other region in the second direction is between the fourth side face position and the second side face position.

(Configuration 13)

The electronic circuit according to Configuration 11 or 12, wherein the first base further includes a second face, the first base includes a first recess including the first side face and a second recess including the second side face, the first base includes a first hole, a second hole, and a third hole, the first hole, the second hole, and the third hole are connected to the first face and the second face, the third side face is at least a part of the first hole, the third other side face is at least a part of the second hole, and the fourth side face is at least a part of the third hole.

(Configuration 14)

The electronic circuit according to any one of Configurations 11-13, wherein the first nonlinear element further includes a first Josephson junction and a second Josephson junction, an end of the first Josephson junction is electrically connected to the first element portion, another end of the first Josephson junction is electrically connected to the third region, an end of the second Josephson junction is electrically connected to the second element portion, another end of the second Josephson junction is electrically connected to the third other region, and a magnetic flux in a space in a loop including the intermediate Josephson junction, the first Josephson junction, and the second Josephson junction is configured to be modulated by a current supplied to the fourth region.

(Configuration 15)

The electronic circuit according to any one of Configurations 1-14, further comprising:

a first element structure, the first element structure including a first element Josephson junction, a first element region connected to the first element Josephson junction, and a first element opposing region, the first base further including a first element side face and a first element opposing side face, the first element side face and the first element opposing side face crossing the plane, the first element region being provided along the first element side face, the first element opposing region being provided along the first element opposing side face, the first element opposing region being electrically connected to the third region, and the first element region being configured to be coupled with one of the first conductive member and the second conductive member.

(Configuration 16)

The electronic circuit according to any one of Configurations 1-14, further comprising:

a first element structure, the first element structure including a first element Josephson junction, a first element region connected to the first element Josephson junction, a second element region connected to the first element Josephson junction, a first element opposing region, and a second element opposing region, the first base further including a first element side face, a second element side face, a first element opposing side face, and a second element opposing side face, the first element side face, the second element side face, the first element opposing side face, and the second element opposing side face crossing the plane, the first element region being provided along the first element side face, the second element region being provided along the second element side face, the first element opposing region being provided along the first element opposing side face, the second element opposing region being provided along the second element opposing side face, a plurality of the first structures being provided, the first element opposing region being electrically connected to the third region included in one of the plurality of first structures, the second element opposing region being electrically connected to the third region included in another one of the plurality of first structures, the first element region being configured to be coupled with one of the first conductive member and the second conductive member included in the one of the plurality of first structures, and the second element region being configured to be coupled with one of the first conductive member and the second conductive member included in the other one of the plurality of first structures.

(Configuration 17)

The electronic circuit according to Configuration 16, wherein the first base further includes a first intermediate hole including a first element opposing side face, and a second intermediate hole including a second element opposing side face, and at least a part of at least one of the first intermediate hole or the second intermediate hole is provided between the first element region and the second element region.

(Configuration 18)

The electronic circuit according to any one of Configurations 1-4, further comprising:

a first element structure; and a second element structure, the first element structure including a first element Josephson junction, a first element region connected to the first element Josephson junction, and a first element opposing region, the second element structure including a second element Josephson junction, a second element region connected to the second element Josephson junction, and a second element opposing region, the first base further including a first element side face, a first element opposing side face, a second element side face, and a second element opposing side face, the first element side face, the first element opposing side face, the second element side face, and the second element opposing side face crossing the plane, the first element region being provided along the first element side face, the first element opposing region being provided along the first element opposing side face, the second element region being provided along the second element side face, the second element opposing region being provided along the second element opposing side face, the first element region being configured to be coupled with the first conductive member, and the second element region being configured to be coupled with the second conductive member.

(Configuration 19)

A computing device, comprising:

the electronic circuit according to any one of Configurations 1-18;

a second base; and a controller provided at the second base, at least a part of the second base overlapping the first base.

(Configuration 20)

A computing device, comprising:

the electronic circuit according to Configuration 11; and a controller, the controller being configured to supply a signal to the fourth conductive member.

According to the embodiment, an electronic circuit and a computing device whose characteristics can be improved can be provided.

In the specification of the application, “perpendicular” and “parallel” refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the electronic circuits and computing devices such as nonlinear elements, Josephson junctions, bases, conductive members, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic circuits and all computing devices practicable by an appropriate design modification by one skilled in the art based on the electronic circuits and the computing devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic circuit, comprising:
a first base; and
a first structure,
the first base including a first face, a first side face, a second side face, a third side face, and a third other side face,
the first side face, the second side face, the third side face, and the third other side face crossing a plane along the first face,
the first structure including a first nonlinear element, a first conductive member, a second conductive member, and a third conductive member,
the first nonlinear element including a first element portion, a second element portion, and an intermediate Josephson junction provided between the first element portion and the second element portion,
the first conductive member including a first region and a first connection region, the first region being provided along the first side face, a part of the first connection region being electrically connected to the first region, another part of the first connection region being electrically connected to the first element portion,
the second conductive member including a second region and a second connection region, the second region being provided along the second side face, a part of the second connection region being electrically connected to the second region, another part of the second connection region being electrically connected to the second element portion, and
the third conductive member including a third region and a third other region, the third region being provided along the third side face, the third other region being provided along the third other side face, a direction from the first region to the third region being along the plane, a direction from the second region to the third other region being along the plane.

2. The electronic circuit according to claim 1, wherein
a third region length of the third region in a first direction is longer than a first region length of the first region in the first direction,
the first direction is perpendicular to the first face, and
a third other region length of the third other region in the first direction is longer than a second region length of the second region in the first direction.

3. The electronic circuit according to claim 2, wherein
the third region length is not less than 2 times and not more than 350 times the first region length, and
the third other region length is not less than 2 times and not more than 350 times the second region length.

4. The electronic circuit according to claim 2, wherein
the third region length is not less than 100 μm and not more than 700 μm,
the first region length is not less than 2 μm and not more than 80 μm,
the third other region length is not less than 100 μm and not more than 700 μm, and,
the second region length is not less than 20 μm and not more than 80 μm.

5. The electronic circuit according to claim 2, wherein
the first base further includes a second face,
a direction from the second face to the first face is along the first direction, and
the first base includes a first recess including the first side face and a second recess including the second side face.

6. The electronic circuit according to claim 5, wherein
the first base includes a first hole connected to the first face and the second face,
the third side face is a part of the first hole, and
the third other side face is another part of the first hole.

7. The electronic circuit according to claim 5, wherein
the first structure further includes a second face conductive film provided along the second face, and
the third conductive member is electrically connected to the second face conductive film.

8. The electronic circuit according to claim 1, wherein
a first capacitor is formed by the first region and the third region,
a second capacitor is formed by the second region and the third other region, and
the third conductive member is configured to be set to a fixed potential.

9. The electronic circuit according to claim 1, wherein
the first nonlinear element further includes a first Josephson junction and a second Josephson junction,
an end of the first Josephson junction is electrically connected to the first element portion,
another end of the first Josephson junction is electrically connected to the third region,
an end of the second Josephson junction is electrically connected to the second element portion, and
another end of the second Josephson junction is electrically connected to the third other region.

10. The electronic circuit according to claim 9, wherein
the first Josephson junction and the second Josephson junction are provided at the first face.

11. The electronic circuit according to claim 1, wherein
the first structure further includes a fourth conductive member including a fourth region,
the first base further includes a fourth side face,
the fourth side face crosses the plane, and
the fourth region is provided along the fourth side face.

12. The electronic circuit according to claim 11, wherein a fourth side face position of the fourth region in a second direction from the second region to the first region is between a first side face position of the first region in the second direction and a second side face position of the second region in the second direction, a third side face position of the third region in the second direction is between the fourth side face position and the first side face position, and a third other side face position of the third other region in the second direction is between the fourth side face position and the second side face position.

13. The electronic circuit according to claim 11, wherein the first base further includes a second face, the first base includes a first recess including the first side face and a second recess including the second side face, the first base includes a first hole, a second hole, and a third hole, the first hole, the second hole, and the third hole are connected to the first face and the second face, the third side face is at least a part of the first hole, the third other side face is at least a part of the second hole, and the fourth side face is at least a part of the third hole.

14. The electronic circuit according to claim 11, wherein the first nonlinear element further includes a first Josephson junction and a second Josephson junction, an end of the first Josephson junction is electrically connected to the first element portion, another end of the first Josephson junction is electrically connected to the third region, an end of the second Josephson junction is electrically connected to the second element portion, another end of the second Josephson junction is electrically connected to the third other region, and a magnetic flux in a space in a loop including the intermediate Josephson junction, the first Josephson junction, and the second Josephson junction is configured to be modulated by a current supplied to the fourth region.

15. The electronic circuit according to claim 1, further comprising:

a first element structure, the first element structure including a first element Josephson junction, a first element region connected to the first element Josephson junction, and a first element opposing region, the first base further including a first element side face and a first element opposing side face, the first element side face and the first element opposing side face crossing the plane, the first element region being provided along the first element side face, the first element opposing region being provided along the first element opposing side face, the first element opposing region being electrically connected to the third region, and the first element region being configured to be coupled with one of the first conductive member and the second conductive member.

16. The electronic circuit according to claim 1, further comprising:

a first element structure, the first element structure including a first element Josephson junction, a first element region connected to the first element Josephson junction, a second element region connected to the first element Josephson junction, a first element opposing region, and a second element opposing region, the first base further including a first element side face, a second element side face, a first element opposing side face, and a second element opposing side face, the first element side face, the second element side face, the first element opposing side face, and the second element opposing side face crossing the plane, the first element region being provided along the first element side face, the second element region being provided along the second element side face, the first element opposing region being provided along the first element opposing side face, the second element opposing region being provided along the second element opposing side face, a plurality of the first structures being provided, the first element opposing region being electrically connected to the third region included in one of the plurality of first structures, the second element opposing region being electrically connected to the third region included in another one of the plurality of first structures, the first element region being configured to be coupled with one of the first conductive member and the second conductive member included in the one of the plurality of first structures, and the second element region being configured to be coupled with one of the first conductive member and the second conductive member included in the other one of the plurality of first structures.

17. The electronic circuit according to claim 16, wherein the first base further includes a first intermediate hole including a first element opposing side face, and a second intermediate hole including a second element opposing side face, and at least a part of at least one of the first intermediate hole or the second intermediate hole is provided between the first element region and the second element region.

18. The electronic circuit according to claim 1, further comprising:

a first element structure; and a second element structure, the first element structure including a first element Josephson junction, a first element region connected to the first element Josephson junction, and a first element opposing region, the second element structure including a second element Josephson junction, a second element region connected to the second element Josephson junction, and a second element opposing region, the first base further including a first element side face, a first element opposing side face, a second element side face, and a second element opposing side face, the first element side face, the first element opposing side face, the second element side face, and the second element opposing side face crossing the plane, the first element region being provided along the first element side face, the first element opposing region being provided along the first element opposing side face, the second element region being provided along the second element side face,
the second element opposing region being provided along the second element opposing side face,
the first element region being configured to be coupled with the first conductive member, and
the second element region being configured to be coupled with the second conductive member.

19. A computing device, comprising:
the electronic circuit according to claim 1;
a second base; and
a controller provided at the second base,
at least a part of the second base overlapping the first base.

20. A computing device, comprising:
the electronic circuit according to claim 11; and
a controller,
the controller being configured to supply a signal to the fourth conductive member.

* * * * *